(12) United States Patent
  Dougakiuchi et al.

(10) Patent No.: US 12,650,377 B2
(45) **Date of Patent: \*Jun. 9, 2026**

(54) PHOTODETECTOR AND BEATING SPECTROSCOPY DEVICE

(71) Applicant: HAMAMATSU PHOTONICS K.K., Hamamatsu (JP)

(72) Inventors: Tatsuo Dougakiuchi, Hamamatsu (JP); Akio Ito, Hamamatsu (JP); Masahiro Hitaka, Hamamatsu (JP); Tadataka Edamura, Hamamatsu (JP); Naota Akikusa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 536 days.

This patent is subject to a terminal disclaimer.

(21) Appl. No.: 17/888,623

(22) Filed: Aug. 16, 2022

(65) Prior Publication Data

US 2023/0030197 A1    Feb. 2, 2023

Related U.S. Application Data

(63) Continuation-in-part of application No. PCT/JP2021/020021, filed on May 26, 2021.

(30) Foreign Application Priority Data

Sep. 16, 2020    (JP) ................................. 2020-155513

(51) Int. Cl.
  *G01N 21/39* (2006.01)
  *G01J 3/10* (2006.01)
  (Continued)

(52) U.S. Cl.
  CPC ............... *G01N 21/39* (2013.01); *G01J 3/10* (2013.01); *G01J 3/427* (2013.01); *G01J 3/45* (2013.01);
  (Continued)

(58) Field of Classification Search
  CPC . G01J 3/427; G01N 21/39; G01N 2201/0612; G01N 2201/0636; H01S 5/3401; H01S 5/4087
  See application file for complete search history.

(56) References Cited

U.S. PATENT DOCUMENTS 3,218,914 A * 11/1965 Bartz ...................... G01J 3/427
                                                          250/343
3,732,014 A * 5/1973 Uzgiris ..................... G01S 7/41
                                                          356/336

(Continued)

FOREIGN PATENT DOCUMENTS

CN        102694050 A      9/2012
JP        H09-61676 A      3/1997

(Continued)

OTHER PUBLICATIONS

Villares, G. et al., 2014, "Dual-comb spectroscopy based on quantum-cascade-laser frequency combs", Nature Communications Oct. 13, 2014:5:5192 (Year: 2014).*

(Continued)

*Primary Examiner* — Blake C Riddick

(74) *Attorney, Agent, or Firm* — Faegre Drinker Biddle & Reath LLP

(57) ABSTRACT

A beating spectroscopy device includes: first and second quantum cascade lasers; a quantum cascade detector; and a sample holder configured to hold a sample on an optical path between the second quantum cascade laser and the quantum cascade detector. Lights from the first and second quantum cascade lasers are detected by the quantum cascade detector while a wavelength of the light from the second quantum cascade laser is changed to scan a frequency of a beating signal having a frequency in accordance with a wavelength difference between the lights from the first and second quantum cascade lasers.

15 Claims, 26 Drawing Sheets

(51) Int. Cl.

| | |
|---|---|
| *G01J 3/427* | (2006.01) |
| *G01J 3/45* | (2006.01) |
| *G01J 3/457* | (2006.01) |
| *H01S 5/34* | (2006.01) |
| *H01S 5/40* | (2006.01) |
| *H10F 77/00* | (2025.01) |
| *H10F 77/124* | (2025.01) |
| *H10F 77/14* | (2025.01) |
| *H10F 77/40* | (2025.01) |
| *H10W 20/40* | (2026.01) |

(52) U.S. Cl.

CPC ............ *G01J 3/457* (2013.01); *H01S 5/3401* (2013.01); *H01S 5/4087* (2013.01); *H10F 77/1248* (2025.01); *H10F 77/146* (2025.01); *H10F 77/147* (2025.01); *H10F 77/407* (2025.01); *H10F 77/933* (2025.01); *H10W 20/483* (2026.01); *G01J 2003/102* (2013.01); *G01N 2201/0612* (2013.01); *G01N 2201/0636* (2013.01)

(56) References Cited

U.S. PATENT DOCUMENTS

| | | | | |
|---|---|---|---|---|
| 4,459,526 | A * | 7/1984 | Griebeler | B25J 19/026 |
| | | | | 318/645 |
| 4,730,116 | A * | 3/1988 | Ida | G01B 11/06 |
| | | | | 250/559.12 |
| 5,349,598 | A * | 9/1994 | Ouchi | H01S 5/1032 |
| | | | | 372/45.01 |
| 5,457,709 | A * | 10/1995 | Capasso | B82Y 20/00 |
| | | | | 372/45.01 |
| 5,479,539 | A * | 12/1995 | Goldsmith | H04B 10/40 |
| | | | | 398/139 |
| 5,552,893 | A * | 9/1996 | Akasu | G01C 3/00 |
| | | | | 356/5.01 |
| 5,666,196 | A * | 9/1997 | Ishii | G01D 5/38 |
| | | | | 250/237 G |
| 5,825,047 | A | 10/1998 | Ajisawa et al. | |
| 5,936,989 | A * | 8/1999 | Capasso | H01S 5/3402 |
| | | | | 372/45.012 |
| 5,999,315 | A * | 12/1999 | Fukano | C03C 17/36 |
| | | | | 65/60.2 |
| 6,344,929 | B1 * | 2/2002 | Sugawara | G02B 27/283 |
| | | | | 362/268 |
| 8,213,022 | B1 * | 7/2012 | Riza | G01B 11/026 |
| | | | | 359/290 |
| 8,912,007 | B2 * | 12/2014 | Bjornson | G01N 21/17 |
| | | | | 422/67 |
| 2004/0016920 | A1 | 1/2004 | Akiyama et al. | |
| 2004/0042085 | A1 * | 3/2004 | Hough | G02B 27/0961 |
| | | | | 362/555 |
| 2005/0148092 | A1 * | 7/2005 | Svanberg | G01N 7/04 |
| | | | | 436/171 |
| 2005/0270543 | A1 * | 12/2005 | Ge | G02B 5/005 |
| | | | | 356/512 |
| 2006/0238763 | A1 * | 10/2006 | Sarvazyan | G01N 21/0332 |
| | | | | 356/432 |
| 2007/0291273 | A1 * | 12/2007 | Yokouchi | G01C 19/66 |
| | | | | 356/459 |
| 2008/0037027 | A1 * | 2/2008 | Harayama | G01C 19/66 |
| | | | | 356/468 |

| | | | | |
|---|---|---|---|---|
| 2008/0067369 | A1 * | 3/2008 | Marchman | H01J 37/226 |
| | | | | 250/306 |
| 2012/0235264 | A1 | 9/2012 | Takabayashi | |
| 2012/0268746 | A1 * | 10/2012 | Wysocki | G01N 21/45 |
| | | | | 356/517 |
| 2013/0195136 | A1 * | 8/2013 | Takagi | H01S 5/2054 |
| | | | | 372/45.012 |
| 2014/0146290 | A1 * | 5/2014 | Sieler | G03B 21/147 |
| | | | | 353/30 |
| 2014/0154822 | A1 * | 6/2014 | Park | G02F 1/3534 |
| | | | | 438/31 |
| 2014/0247851 | A1 * | 9/2014 | Hashimoto | H01S 5/3402 |
| | | | | 372/45.012 |
| 2014/0285803 | A1 | 9/2014 | Alouini et al. | |
| 2014/0355637 | A1 * | 12/2014 | Hashimoto | H01S 5/34313 |
| | | | | 372/45.012 |
| 2015/0123076 | A1 * | 5/2015 | Fujita | H10F 30/10 |
| | | | | 257/20 |
| 2017/0040769 | A1 * | 2/2017 | Hashimoto | H01S 5/0261 |
| 2017/0115213 | A1 * | 4/2017 | Ito | H01S 5/0264 |
| 2017/0243994 | A1 * | 8/2017 | Dougakiuchi | H01L 31/109 |
| 2017/0250083 | A1 | 8/2017 | Alijabbari et al. | |
| 2018/0048124 | A1 | 2/2018 | Tsuji | |
| 2018/0122539 | A1 | 5/2018 | Park et al. | |
| 2019/0265160 | A1 * | 8/2019 | Koulikov | G01N 21/716 |
| 2020/0018701 | A1 * | 1/2020 | Meyer | G01J 3/0259 |
| 2021/0028214 | A1 * | 1/2021 | Stanton | H01L 31/0224 |
| 2021/0135431 | A1 * | 5/2021 | Hashimoto | H01S 5/3401 |
| 2021/0135432 | A1 * | 5/2021 | Yoshinaga | H01S 5/3401 |
| 2021/0305769 | A1 * | 9/2021 | Hashimoto | H01S 5/3402 |
| 2021/0305785 | A1 * | 9/2021 | Hashimoto | H01S 5/3402 |
| 2021/0336417 | A1 * | 10/2021 | Hashimoto | H01S 5/227 |
| 2021/0396665 | A1 * | 12/2021 | Meyer | H01S 5/1032 |

FOREIGN PATENT DOCUMENTS

| | | |
|---|---|---|
| JP | 2003-309282 A | 10/2003 |
| JP | 2011-114015 A | 6/2011 |
| JP | 2017-003301 A | 1/2017 |
| JP | 2017-147428 A | 8/2017 |

OTHER PUBLICATIONS

English-language translation of International Preliminary Report on Patentability (IPRP) dated Mar. 30, 2023 that issued in WO Patent Application No. PCT/JP2021/020021.

Tatsuo Dougakiuchi and Naota Akikusa, "Application of High-Speed Quantum Cascade Detectors for Mid-Infrared, Broadband, High-Resolution Spectroscopy," Sensors (Basel), Aug. 24, 2021;21(17):5706.

Grant P.D. et al., "Ultra-high frequency monolithically integrated quantum well infrared photodetector up to 75 GHz", Electronics Letters vol. 41, No. 4,, Feb. 17, 2005, XP093099213.

Zhou Yuhong et al, "High-speed, room-temperature quantum cascade detectors at 4.3[mu]m", AIP Advances, American Institute of Physics, 2 Huntington Quadrangle, Melville, NY 11747,vol. 6, No. 3, Mar. 7, 2016, XP012205545.

Dougakiuchi Tatsuo et al, "Ultimate response time in mid-infrared high-speed low-noise quantum cascade detectors", Applied Physics Letters, American Institute of Physics, 2 Huntington Quadrangle, Melville, NY 11747,vol. 118, No. 4, Jan. 25, 2021, XP012253210.

B.L. Shoop et al. "New Devices for Optoelectronics. Fiber Optic Data Communication", Technology Advances and Futures, 2002, p. 352.

U.S. Office Action issued May 20, 2025 in U.S. Appl. No. 18/023,418.

\* cited by examiner

*Fig.4*
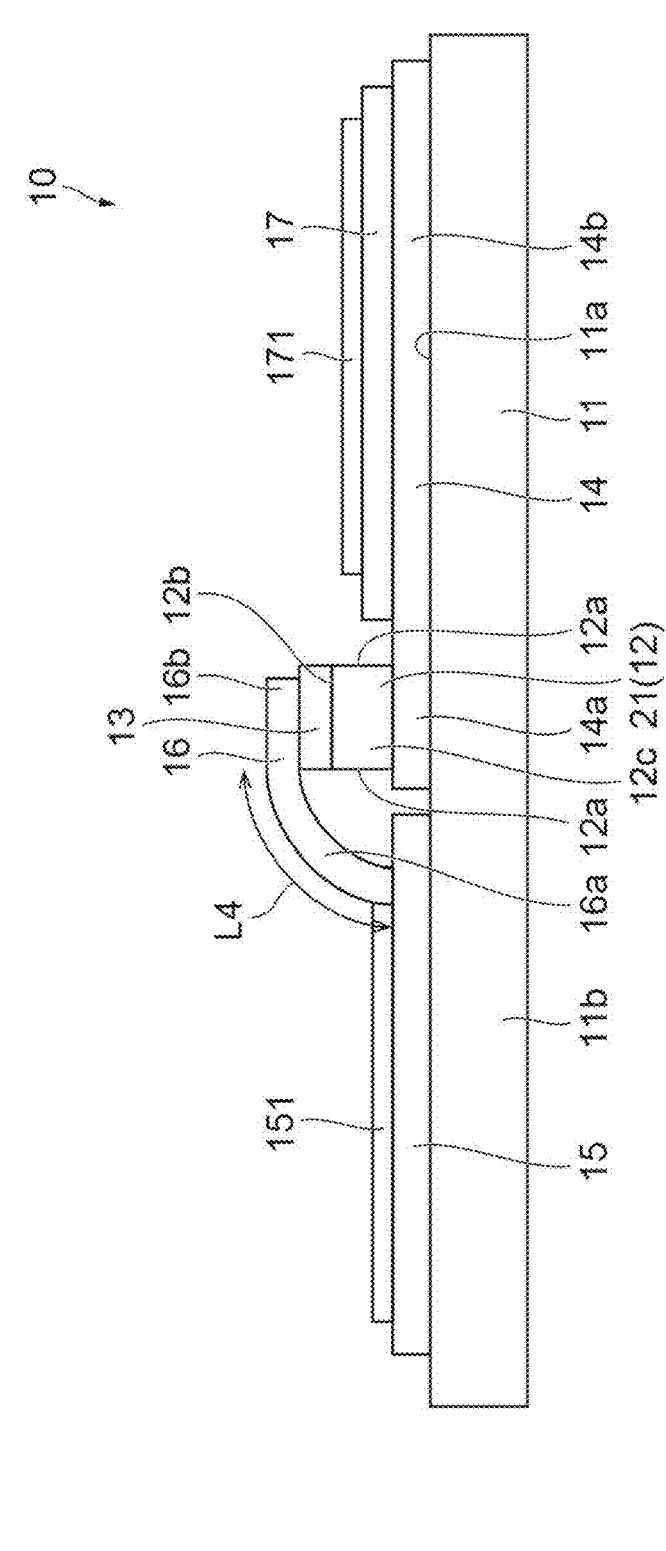
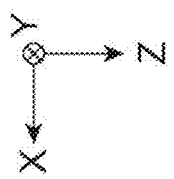

*Fig.5*

| SEMICONDUCTOR LAYER | | COMPOSITION | LAYER THICKNESS (nm) | DOPING |
|---|---|---|---|---|
| FIRST CONTACT LAYER 13 | | InGaAs | 30 | Si doped: $2\times10^{18}/cm^3$ |
| ABSORPTION REGION 22 | BARRIER LAYER 261 | InAlAs | 3 | undoped |
| | WELL LAYER 271 | InGaAs | 4.4 | Si doped: $4\times10^{17}/cm^3$ |
| TRANSPORT REGION 23 | BARRIER LAYER 262 | InAlAs | 2.5 | undoped |
| | WELL LAYER 272 | InGaAs | 0.9 | undoped |
| | BARRIER LAYER 263 | InAlAs | 4 | undoped |
| | WELL LAYER 273 | InGaAs | 1.3 | undoped |
| | BARRIER LAYER 264 | InAlAs | 3.3 | undoped |
| | WELL LAYER 274 | InGaAs | 1.4 | undoped |
| | BARRIER LAYER 265 | InAlAs | 3.6 | undoped |
| | WELL LAYER 275 | InGaAs | 1.5 | undoped |
| | BARRIER LAYER 266 | InAlAs | 2.8 | undoped |
| | WELL LAYER 276 | InGaAs | 2.5 | undoped |
| | BARRIER LAYER 267 | InAlAs | 2.7 | undoped |
| | WELL LAYER 277 | InGaAs | 2.8 | undoped |
| SECOND CONTACT LAYER 14 | | InGaAs | 1200 | Si doped: $2\times10^{18}/cm^3$ |

UNIT STACKED BODIES 24 × 90

*Fig.7*
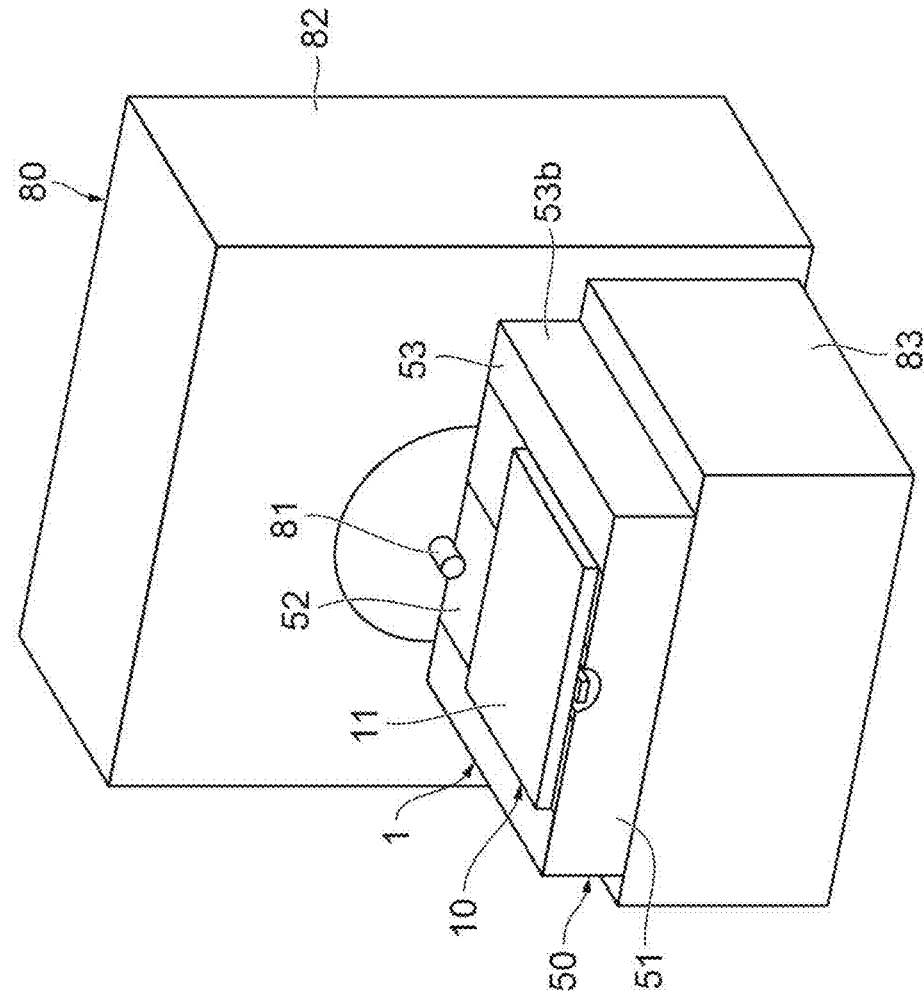
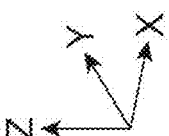

*Fig.8*
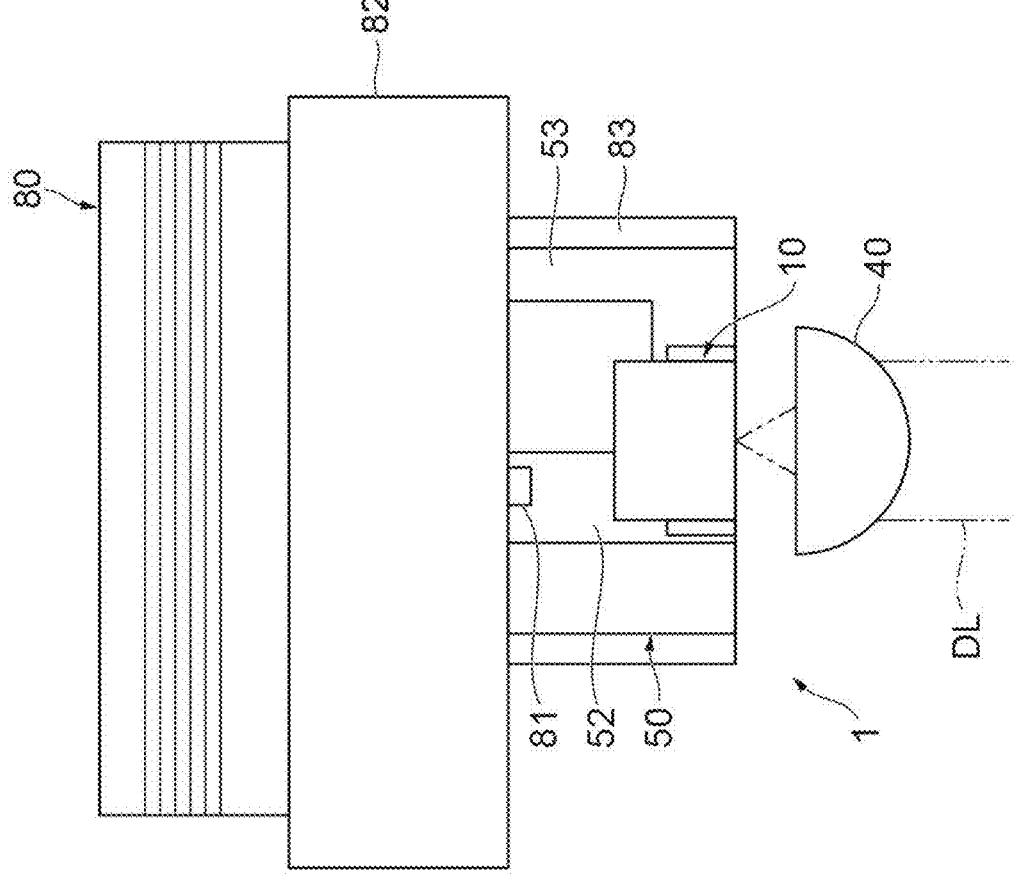
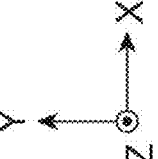

1

PHOTODETECTOR AND BEATING SPECTROSCOPY DEVICE

CROSS-REFERENCE TO RELATED APPLICATIONS

This application is a Continuation-In-Part application of PCT/JP2021/020021 claiming the benefit of priority of the Japanese Patent Application No. 2020-155513 filed on Sep. 16, 2020, the entire contents of which are incorporated herein by reference.

TECHNICAL FIELD

One aspect of the present disclosure relates to a photodetector and a beating spectroscopy device.

BACKGROUND ART

Patent Literature 1 discloses a quantum cascade detector. The quantum cascade detector detects light using intersubband transition (intersubband absorption) in a quantum well structure.

CITATION LIST

Patent Literature

Patent Literature 1: Japanese Unexamined Patent Publication No. 2017-147428

SUMMARY OF INVENTION

Technical Problem

The photodetector as described above requires an increase in response speed. In addition, both ensuring output signal intensity and ensuring reliability are required. Therefore, an object of one aspect of the present disclosure is to provide a photodetector capable of realizing increasing response speed, ensuring output signal intensity, and ensuring reliability, and a beating spectroscopy device capable of widening a wavelength scanning range.

Solution to Problem

A photodetector according to one aspect of the present disclosure includes: a semiconductor substrate including a major surface; a mesa portion that includes an active layer in which absorption regions that absorb detection light through intersubband absorption and transport regions that transport electrons excited by the intersubband absorption are alternately stacked, and that is formed on the major surface of the semiconductor substrate to extend along an optical waveguide direction; a first contact layer formed on a surface of the mesa portion on a side opposite to the semiconductor substrate; a second contact layer formed between the major surface of the semiconductor substrate and the mesa portion; a first electrode formed on the major surface of the semiconductor substrate; and an air bridge wiring electrically connected to the first contact layer and the first electrode. When viewed in a direction perpendicular to the major surface of the semiconductor substrate, a length of the mesa portion in the optical waveguide direction is longer than a length of the mesa portion in a direction perpendicular to the optical waveguide direction. The air bridge wiring is led out from the first contact layer to one side in the direction perpendicular to the optical waveguide direction, and is bridged between the first contact layer and the first electrode.

In the photodetector, the first contact layer and the first electrode are connected to each other by the air bridge wiring. Accordingly, for example, compared to when the first contact layer and the first electrode are connected to each other by wire bonding, a wiring length can be shortened, and an area of the mesa portion in a plan view can be reduced. Inductance can be reduced by shortening the wiring length, and response speed can be increased. In addition, parasitic capacitance can be reduced by reducing the area of the mesa portion, and thus the response speed can also be increased. On the other hand, when the area of the mesa portion is simply reduced, it is concerned that output signal intensity decreases. In this respect, in the photodetector, when viewed in the direction perpendicular to the major surface of the semiconductor substrate, the length of the mesa portion in the optical waveguide direction is longer than the length of the mesa portion in the direction perpendicular to the optical waveguide direction. Accordingly, light can be effectively absorbed in the mesa portion, and output signal intensity can be certainly ensured even when the area of the mesa portion is reduced. Further, in the photodetector, the air bridge wiring is led out from the first contact layer to the one side in the direction perpendicular to the optical waveguide direction, and is bridged between the first contact layer and the first electrode. Accordingly, a width (length in the optical waveguide direction) of the air bridge wiring can be ensured. When the wiring width is wide, inductance can be further reduced and strength of the air bridge wiring can be ensured to ensure reliability. Therefore, according to the photodetector, increasing response speed, ensuring output signal intensity, and ensuring reliability can be realized.

The first electrode may include a connection portion located on the one side in the direction perpendicular to the optical waveguide direction with respect to the mesa portion, and the air bridge wiring may be led out from the first contact layer to the one side in the direction perpendicular to the optical waveguide direction, and connected to the connection portion of the first electrode. In this case, the air bridge wiring can be led out from the first contact layer to the one side in the direction perpendicular to the optical waveguide direction, and the width of the air bridge wiring can be certainly ensured.

The air bridge wiring may include a bridge portion extending in air, and a length of the bridge portion in the optical waveguide direction may be longer than a length of the bridge portion in the direction perpendicular to the optical waveguide direction. In this case, a width of the bridge portion (air bridge wiring) can be certainly ensured.

The air bridge wiring may include a bridge portion extending in air, and each of the length of the mesa portion in the optical waveguide direction and a length of the bridge portion in the optical waveguide direction may be 50 $\mu$m or more. In this case, a width of the bridge portion can be certainly ensured. In addition, the length of the mesa portion in the optical waveguide direction can be ensured, and light can be more effectively absorbed in the mesa portion.

A ratio of the length of the mesa portion in the optical waveguide direction to the length of the mesa portion in the direction perpendicular to the optical waveguide direction may be greater than 1 and less than 100. In this case, the length of the mesa portion in the optical waveguide direction can be ensured, and light can be more effectively absorbed in the mesa portion.

The air bridge wiring may include a bridge portion extending in air, and a ratio of a length of the bridge portion in the optical waveguide direction to a length of the bridge portion in the direction perpendicular to the optical waveguide direction may be greater than 1 and less than 50. In this case, a width of the bridge portion (air bridge wiring) can be certainly ensured.

The air bridge wiring may include a bridge portion extending in air, and a thickness of the bridge portion may be equal to or more than 1 μm and equal to or less than 10 μm. In this case, reliability can be certainly ensured.

One end surface of the mesa portion in the optical waveguide direction may be an incident surface of the detection light. In this case, light can be more effectively absorbed in the mesa portion, and output signal intensity can be certainly ensured.

The one end surface of the mesa portion in the optical waveguide direction may be flush with one end surface of the semiconductor substrate in the optical waveguide direction. In this case, the one end surface of the mesa portion in the optical waveguide direction can be easily used as the incident surface of the detection light.

The photodetector according to one aspect of the present disclosure may further include a lens that is disposed to face an end surface of the mesa portion, and that converges the detection light toward the end surface of the mesa portion. In this case, a width (length in the direction perpendicular to the optical waveguide direction) of the end surface of the mesa portion can be narrowed, and the area of the mesa portion in a plan view can be reduced. As a result, parasitic capacitance can be reduced, and the response speed can be further increased. In addition, when the area of the mesa portion is assumed to be constant, the length of the mesa portion in the optical waveguide direction can be lengthened by narrowing the width of the mesa portion. As a result, light can be more effectively absorbed in the mesa portion, and output signal intensity can be certainly ensured.

Both side surfaces of the mesa portion in the direction perpendicular to the optical waveguide direction may be exposed. In this case, the generation of parasitic capacitance can be suppressed, and the response speed can be further increased.

When viewed in the direction perpendicular to the major surface of the semiconductor substrate, the second contact layer may include a first portion located between the major surface of the semiconductor substrate and the mesa portion, and a second portion located outside the mesa portion, and the second electrode may be formed on the second portion of the second contact layer. In this case, a large area of the second electrode can be ensured, and the connection member can be well connected to the second electrode.

A beating spectroscopy device according to one aspect of the present disclosure includes: a fixed wavelength light source; a variable wavelength light source; and the photodetector that detects light from the fixed wavelength light source and light from the variable wavelength light source as detection light. The light from the fixed wavelength light source and the light from the variable wavelength light source are detected by the photodetector while a wavelength of the light from the variable wavelength light source is changed to scan a frequency of a beating signal having a frequency in accordance with a wavelength difference between the light from the fixed wavelength light source and the light from the variable wavelength light source. In the photodetector included in the beating spectroscopy device, response speed is increased for the above-described reasons.

For this reason, in the beating spectroscopy device, a wavelength scanning range in beating spectroscopy can be widened.

Advantageous Effects of Invention

According to one aspect of the present disclosure, it is possible to provide the photodetector capable of realizing increasing response speed, ensuring output signal intensity, and ensuring reliability, and the beating spectroscopy device capable of widening the wavelength scanning range.

BRIEF DESCRIPTION OF DRAWINGS

FIG. 4 is a front view of the photodetector.

FIG. 5 is a table showing a configuration of the photodetector.

FIG. 7 is a perspective view showing a mounting state of the photodetection module.

FIG. 8 is a plan view showing a mounting state of the photodetection module.

5

Figure 26:
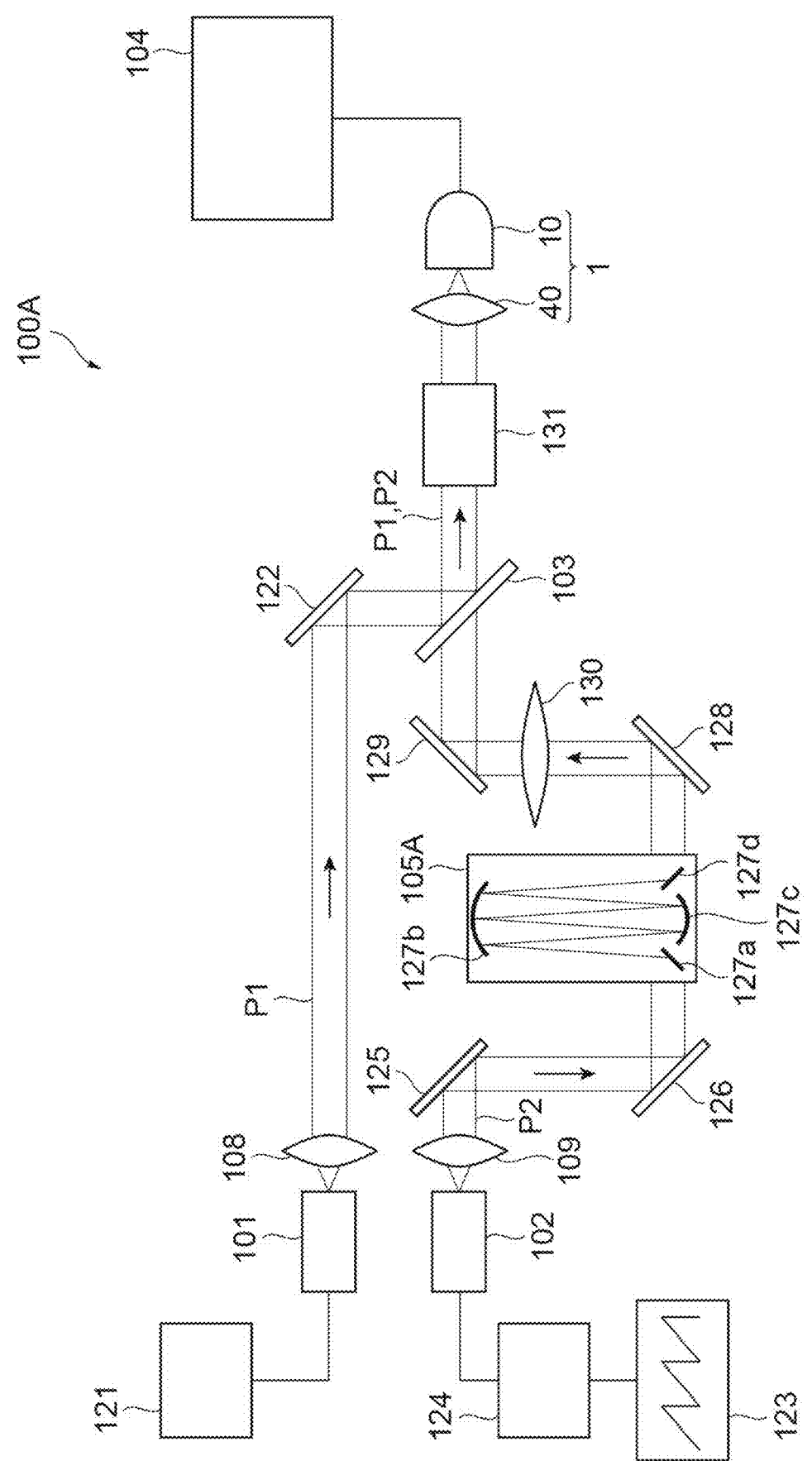

FIG. 26 is a view showing a configuration of a beating spectroscopy device according to a fourth modification example.

DESCRIPTION OF EMBODIMENTS

Figure 1:
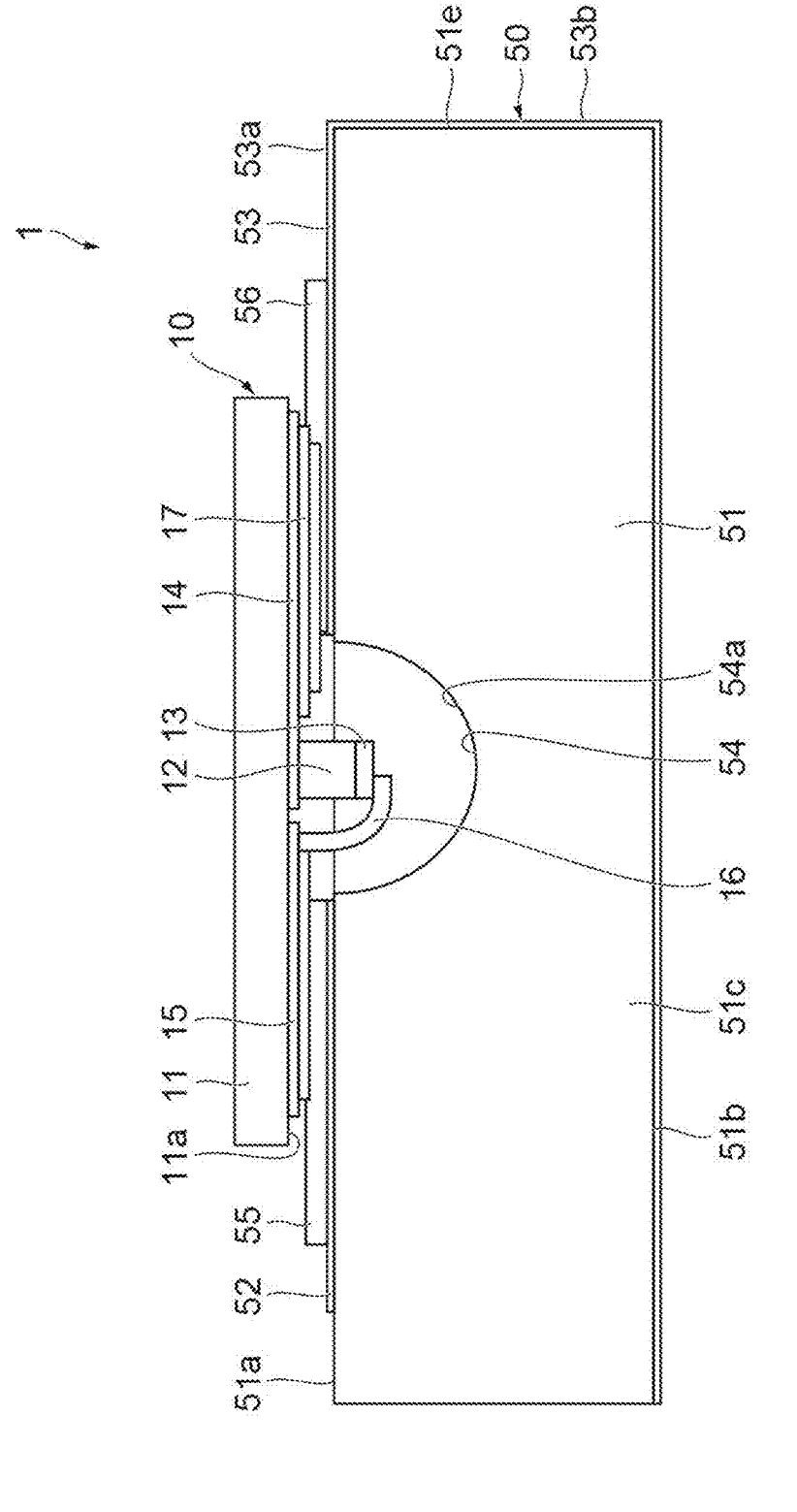
FIG. 1 is a front view of a photodetection module of an embodiment.
Figure 2:
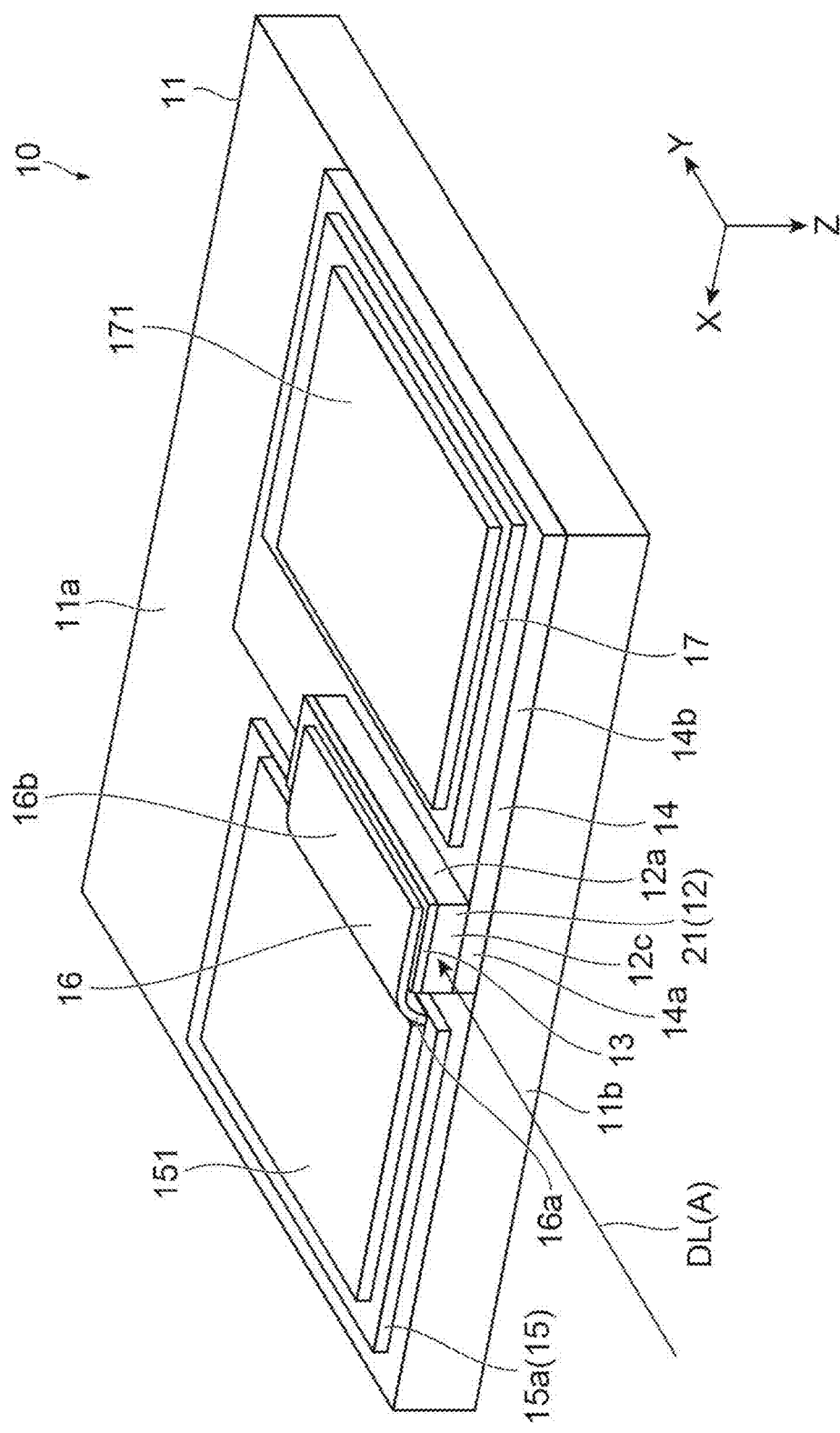
FIG. 2 is a perspective view of a photodetector.
Figure 3:
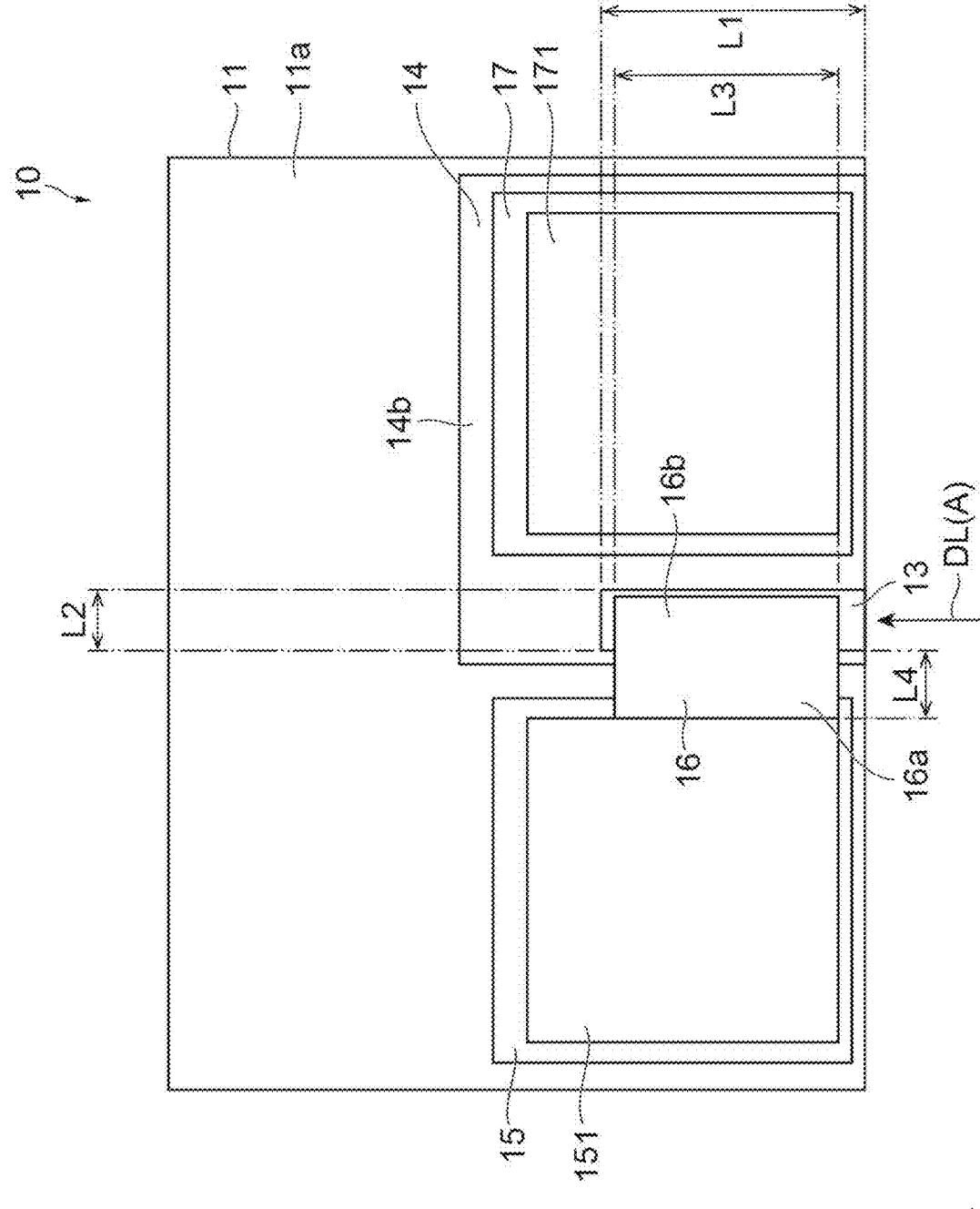
FIG. 3 is a plan view of the photodetector.

Hereinafter, one embodiment of the present disclosure will be described in detail with reference to the drawings. In the following description, the same reference signs are used for the same or corresponding elements, and duplicated descriptions will be omitted.
[Photodetection Module]
As shown in FIG. 1, the photodetection module 1 includes a photodetector 10 and a fixing member (submount) 50 to which the photodetector 10 is fixed. The photodetector 10 is, for example, a quantum cascade detector (QCD), and detects detection light DL using intersubband transition (intersubband absorption) in a quantum well structure.
[Photodetector]
As shown in FIGS. 2, 3, and 4, the photodetector 10 includes a semiconductor substrate 11, a mesa portion 12, a first contact layer 13, a second contact layer 14, a first electrode 15, an air bridge wiring 16, and a second electrode 17.

The semiconductor substrate 11 is formed in, for example, a rectangular flat plate shape, and has a flat major surface 11a. The semiconductor substrate 11 is, for example, a semi-insulating InP substrate. Hereinafter, a width direction, a depth direction, and a thickness direction of the semiconductor substrate 11 will be described as an X direction, a Y direction, and a Z direction, respectively. The X direction, the Y direction, and the Z direction are orthogonal to each other. Incidentally, in FIGS. 2 to 4, each configuration of the photodetector 10 is disposed to be inverted with respect to the X direction relative to FIG. 1. Actually, each configuration of the photodetector 10 is disposed to be inverted with respect to the X direction relative to the disposition shown in FIGS. 2 to 4. In short, as will be described later, each element may be disposed such that the first electrode 15 is connected to a first wiring 52 and the second electrode 17 is connected to a second wiring 53.

The mesa portion 12 is formed on the major surface 11a of the semiconductor substrate 11 to extend along an optical waveguide direction A. The optical waveguide direction A is parallel to the Y direction. The mesa portion 12 is formed on the major surface 11a with the second contact layer 14 interposed therebetween, and protrudes from the semiconductor substrate 11 in the Z direction. Each of a pair of side surfaces 12a of the mesa portion 12 in the X direction is exposed. Namely, each of the side surfaces 12a is not covered with other elements. The side surfaces 12a are surfaces extending to intersect the X direction, and are flat surfaces perpendicular to the X direction in this example.

The mesa portion 12 includes an active layer 21. As shown in FIG. 5, the active layer 21 includes a plurality of absorption regions 22 and a plurality of transport regions 23 that are alternately stacked along the Z direction (direction perpendicular to the major surface 11a of the semiconductor substrate 11), and has a quantum cascade structure. In the active layer 21, unit stacked bodies 24 each formed of a pair of the absorption region 22 and the transport region 23 are repeatedly stacked. In this example, the active layer 21 is configured to have a peak sensitivity wavelength of 4.5 μm, and includes the unit stacked bodies 24 of 90 cycles. The number of cycles of the unit stacked bodies 24 may be, for example, 10 or more and 150 or less.

Each of the absorption regions 22 includes a barrier layer 261 and a well layer 271, and absorbs the detection light DL through intersubband absorption. Each of the transport regions 23 includes a plurality of barrier layers 262 to 267 and a plurality of well layers 272 to 277, and transports electrons excited by intersubband absorption in the absorption region 22, to the absorption region 22 of the next cycle. One example of compositions, layer thicknesses, and doping states of the barrier layers 261 to 267 and of the well layers 272 to 277 is as shown in FIG. 5.

When the detection light DL is incident on the active layer 21, the detection light DL is absorbed in the active layer 21. More specifically, electron excitation by intersubband absorption, the relaxation and transport of excited electrons, and the extraction of electrons to the unit stacked body 24 of the next cycle are repeated in a plurality of the unit stacked bodies 24, so that light absorption occurs in the active layer 21 in a cascade manner. In the photodetection module 1, a current generated by the light absorption is extracted as an electrical signal, and the detection light DL is detected by measuring an amount of the current. Namely, the active layer 21 functions as a semiconductor region that generates an electrical signal in accordance with an incident amount of the detection light DL.

The mesa portion 12 is formed long in the Y direction, and is formed in, for example, a rectangular shape in which long sides are parallel to the Y direction, in a plan view (when viewed in the Z direction). Namely, in a plan view, a length L1 of the mesa portion 12 in the Y direction (optical waveguide direction A) is longer than a length (width) L2 of the mesa portion 12 in the X direction (direction perpendicular to the optical waveguide direction A). The length L1 is, for example, 50 μm or more. The length L1 is, for example, approximately 50 μm to 3000 μm, and is 100 μm in this example. The length L2 is, for example, approximately 10 μm to 1000 μm, and is 25 μm in this example. An aspect ratio (ratio of the length L1 to the length L2) of the mesa portion 12 in a plan view is 1 to 100. The aspect ratio of the mesa portion 12 may be 1.5 to 50, preferably 2 to 10. The lengths L1 and L2 may be 10 μm or more. When the length L1 is less than 50 it is difficult to ensure output signal intensity. When the length L2 is less than 10 it is difficult to form the air bridge wiring 16. When the length L1 is greater than 3000 μm or the length L2 is greater than 1000 the element size increases, and it is difficult to realize a high cutoff.

The first contact layer 13 is an upper contact layer formed on a surface 12b of the mesa portion 12 on a side opposite to the semiconductor substrate 11. The second contact layer 14 is a lower contact layer formed between the major surface 11a of the semiconductor substrate 11 and the mesa portion 12. One example of compositions, layer thicknesses, and doping states of the first contact layer 13 and of the second contact layer 14 is as shown in FIG. 5.

The second contact layer 14 is formed in a rectangular shape in which a length of each side is longer than that of the mesa portion 12, and includes a portion protruding from the mesa portion 12. Namely, in a plan view, the second contact layer 14 includes a first portion 14a located between the major surface 11a of the semiconductor substrate 11 and the mesa portion 12, and a second portion 14b located outside the mesa portion 12.

The mesa portion 12, the first contact layer 13, and the second contact layer 14 are formed on the major surface 11a of the semiconductor substrate 11, for example, by crystal growth. The mesa portion 12, the first contact layer 13, and the second contact layer 14 are formed by performing etching to reach a surface of the second contact layer 14 or the inside of the second contact layer 14, using a photolithography technology and a dry etching technology after the crystal growth. During manufacturing, for example, a plurality of elements are collectively formed by forming a plurality of portions corresponding to the mesa portion 12, to the first contact layer 13, and to the second contact layer 14 on a wafer, and then by cutting the wafer.

In this example, one end surface 12c of the mesa portion 12 in the Y direction (optical waveguide direction A) (direction parallel to the major surface 11a of the semiconductor substrate 11) is an incident surface (light receiving surface) of the detection light DL. The detection light DL incident from the end surface 12c travels through the mesa portion 12 along the optical waveguide direction A. The end surface 12c is flush with a side surface 11b of the semiconductor substrate 11. Namely, the end surface 12c and the side surface 11b are located on the same plane. The side surface 11b is a surface extending to intersect the Y direction, and is a flat surface perpendicular to the Y direction in this example. In this example, the side surface 11b and the end surface 12c are cleavage surfaces formed by cutting the wafer.

The first electrode 15 is formed in a planar shape on the major surface 11a of the semiconductor substrate 11. The first electrode 15 is made of, for example, gold and is formed in a square shape by patterning. The first electrode 15 includes a connection portion 15a located on one side in the X direction with respect to the mesa portion 12. In this example, the connection portion 15a is the entirety of the first electrode 15. The first electrode 15 is electrically connected to the first contact layer 13 through the air bridge wiring 16. The first electrode 15 is provided to extract a current output from the active layer 21, to the outside. An area of the first electrode 15 is, for example, 10000 μm² or more. In this case, the first electrode 15 and the first wiring 52 to be described later can be suitably brought into surface contact with each other. In this example, dimensions of the first electrode 15 are 400 μm×400 μm.

The air bridge wiring 16 is a connection wiring that is electrically connected to the first contact layer 13 and the first electrode 15. The air bridge wiring 16 is led out from the first contact layer 13 to the one side in the X direction, and is bridged between the first contact layer 13 and the first electrode 15. In this example, the air bridge wiring 16 is led out from the first contact layer 13 in a direction parallel to the X direction. In a plan view, the air bridge wiring 16 is led out from an end portion of the first contact layer 13 (mesa portion 12) in the X direction. The air bridge wiring 16 is an aerial wiring (three-dimensional wiring) including a bridge portion 16a extending in air. The bridge portion 16a is electrically connected to the first electrode 15 (connection portion 15a) through a plating layer 151 to be described later. The air bridge wiring 16 further includes a portion 16b having a planar shape that is formed on the first contact layer 13. The bridge portion 16a is integrally formed with the portion 16b.

The air bridge wiring 16 is formed, for example, by the following step. First, a resist is formed in a region between the mesa portion 12 and the first electrode 15 on the major surface 11a of the semiconductor substrate 11 by patterning. Subsequently, a gold thin film having a thickness of approximately 5 μm is formed on the resist by plating, and thereafter, the resist is removed. Accordingly, the air bridge wiring 16 having a sheet shape is formed.

The bridge portion 16a is formed in a wide sheet shape (layer shape). A length (width) L3 of the bridge portion 16a in the Y direction (optical waveguide direction A) is longer than a length L4 of the bridge portion 16a in the X direction. In this example, the bridge portion 16a extends curvedly when viewed in the Y direction. In this case, as shown in FIG. 4, the length L4 of the bridge portion 16a in the X direction is a length (actual length) of the bridge portion 16a along an extending direction. The length L3 is, for example, 50 μm or more. The length L3 is, for example, approximately 50 μm to 3000 μm, and is 80 μm in this example. The length L4 is, for example, approximately 5 μm to 200 μm, and is 30 μm in this example. An aspect ratio (ratio of the length L3 to the length L4) of the bridge portion 16a may be 0.25 to 100, preferably 1 to 50. The aspect ratio of the bridge portion 16a may be more preferably 1 to 20, further preferably 2 to 10. A thickness of the bridge portion 16a (air bridge wiring 16) in the Z direction is equal to or more than 1 μm and equal to or less than 10 μm.

The second electrode 17 is formed in a planar shape on the second portion 14b of the second contact layer 14. In other words, the second electrode 17 is formed in a planar shape on the major surface 11a of the semiconductor substrate 11 with the second contact layer 14 interposed therebetween. The second electrode 17 is made of, for example, gold and is formed in a square shape by patterning. The second electrode 17 is disposed on the other side in the X direction (side opposite the first electrode 15) with respect to the mesa portion 12. The second electrode 17 is electrically connected to the second contact layer 14. The second electrode 17 is provided to extract a current output from the active layer 21, to the outside. The second electrode 17 is electrically isolated from the first electrode 15. An area of the second electrode 17 is, for example, 10000 μm² or more. In this case, the second electrode 17 and the second wiring 53 to be described later can be suitably brought into surface contact with each other. In this example, dimensions of the second electrode 17 are 400 μm×400 μm, and are the same as those of the first electrode 15.

When plating is performed in the step of forming the air bridge wiring 16 described above, plating layers may be formed on the first electrode 15 and on the second electrode 17. In FIGS. 2 to 4, these plating layers are indicated by reference signs 151 and 171. The plating layers 151 and 171 can be regarded as forming the first electrode 15 and the second electrode 17, respectively. In this example, the plating layer 151 is formed with a size smaller than the first electrode 15 (formed on only a part of the first electrode 15), but may be formed on the entire surface of the first electrode 15. Similarly, the plating layer 171 is formed with a size smaller than the second electrode 17, but may be formed on the entire surface of the second electrode 17. The plating layer 151 can be regarded as forming the air bridge wiring 16. The plating layers 151 and 171 may not be formed.

[Fixing Member]

Figure 6:
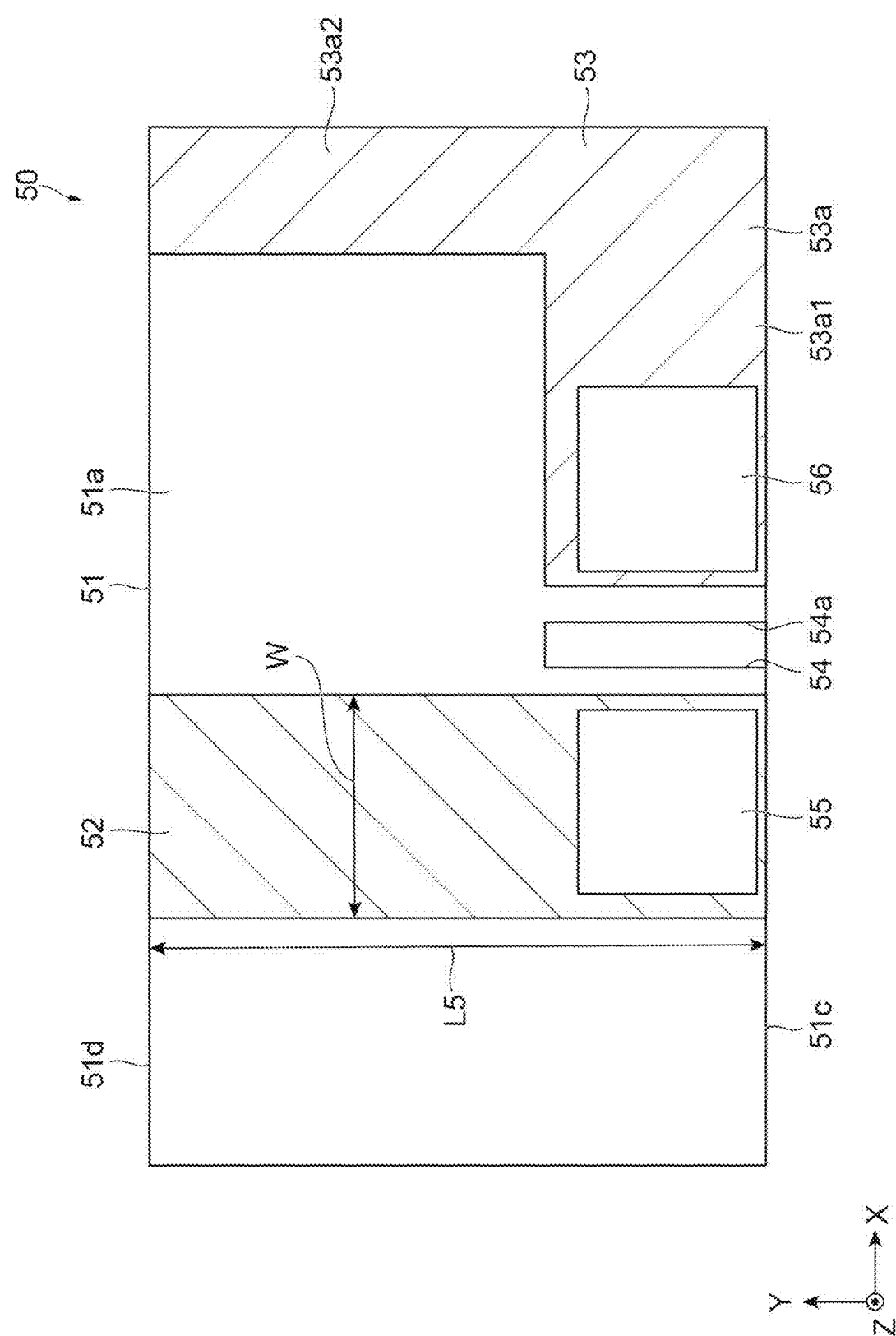
FIG. 6 is a plan view of a fixing member.

As shown in FIGS. 1 and 6, the fixing member 50 includes an insulating substrate 51, the first wiring 52, and the second wiring 53. In FIG. 6, the first wiring 52 and the second wiring 53 are hatched for ease of understanding. The insulating substrate 51 is formed in, for example, a rectangular flat plate shape, and has a major surface 51a and a 51b opposite the major surface 51a. In this example, the major surfaces 51a and 51b are flat surfaces parallel to each other. A base material of the insulating substrate 51 is, for example, alumina (aluminum oxide). In this case, dielectric loss in a high frequency band can be reduced. The base material of the insulating substrate 51 may be SiC or ceramic that is a highly insulating material.

A recessed portion 54 is formed in the major surface 51*a* of the insulating substrate 51. In this example, the recessed portion 54 is a groove extending along the Y direction (optical waveguide direction A), and is open on a side surface 51*c* of the insulating substrate 51. Namely, the recessed portion 54 extends to reach the side surface 51*c*. The side surface 51*c* is a surface extending to intersect the Y direction, and is a flat surface perpendicular to the Y direction in this example. As one example, the recessed portion 54 has a rectangular shape in a plan view, and has a substantially semicircular shape in a cross section perpendicular to the Y direction.

The first wiring 52 is formed in a planar shape on the major surface 51*a* of the insulating substrate 51. The first wiring 52 is made of, for example, gold and is formed in a predetermined shape by patterning. The first wiring 52 is disposed on the one side in the X direction with respect to the recessed portion 54. The first wiring 52 is formed in a rectangular shape in which long sides are parallel to the Y direction, and extends across the side surfaces 51*c* and 51*d* of the insulating substrate 51. The side surface 51*d* is a surface of the insulating substrate 51 on a side opposite to the side surface 51*c*.

The second wiring 53 is formed in a planar shape on the major surface 51*a* of the insulating substrate 51. The second wiring 53 is electrically isolated from the first wiring 52. The second wiring 53 is made of, for example, gold and is formed in a predetermined shape by patterning. The second wiring 53 is formed to reach (wrap around) from the major surface 51*a* of the insulating substrate 51 to the major surface 51*b* through a side surface 51*e*. Namely, the second wiring 53 includes a first portion 53*a* disposed on the major surface 51*a*, and a second portion 53*b* disposed over the major surface 51*b* and the side surface 51*e*. The first portion 53*a* is disposed on the other side in the X direction (side opposite the first wiring 52) with respect to the recessed portion 54. The first portion 53*a* includes a portion 53*a*1 formed in a rectangular shape in which long sides are parallel to the X direction, and a portion 53*a*2 formed in a rectangular shape in which long sides are parallel to the Y direction. The portion 53*a*2 extends from the portion 53*a*1 to reach the side surface 51*d* of the insulating substrate 51. The second portion 53*b* is formed on the entireties of the major surface 51*b* and of the side surface 51*e*.

A solder layer 55 is formed on the first wiring 52, and a solder layer 56 is formed on the second wiring 53. The solder layer 56 is formed on the portion 53*a*1 of the second wiring 53. Each of the solder layers 55 and 56 is formed in, for example, a square shape from a metal material, and has a thickness of approximately equal to or more than 1 μm and equal to or less than 10 μm.

As shown in FIG. 1, the photodetector 10 is fixed to the fixing member 50 in a state where the major surface 11*a* of the semiconductor substrate 11 faces the major surface 51*a* of the insulating substrate 51. In a fixed state where the photodetector 10 is fixed to the fixing member 50, at least a part of the mesa portion 12 is disposed inside the recessed portion 54. In this example, a tip portion (end portion opposite the semiconductor substrate 11 in the Y direction) of the mesa portion 12 is disposed inside the recessed portion 54. The mesa portion 12 is separated from an inner surface 54*a* of the recessed portion 54. A longitudinal direction of the mesa portion 12 is parallel to a longitudinal direction of the recessed portion 54. The end surface 12*c* of the mesa portion 12 is exposed from the recessed portion 54 when viewed in the Y direction. In the fixed state, a part of the air bridge wiring 16 (bridge portion 16*a*) is also disposed inside the recessed portion 54 to be separated from the inner surface 54*a*. Accordingly, a connection portion between the air bridge wiring 16 and the first contact layer 13 is disposed inside the recessed portion 54.

The photodetector 10 is fixed to the fixing member 50 by connecting the first electrode 15 to the first wiring 52 and by connecting the second electrode 17 to the second wiring 53. The first electrode 15 is fusion-bonded to the first wiring 52 using the solder layer 55, and is electrically connected to the first wiring 52 in a state where the first electrode 15 is in surface contact with the first wiring 52 with the solder layer 55 interposed therebetween. The second electrode 17 is fusion-bonded to the second wiring 53 using the solder layer 56, and is electrically connected to the second wiring 53 in a state where the second electrode 17 is in surface contact with the second wiring 53 with the solder layer 56 interposed therebetween. Each of a contact area between the first electrode 15 and the first wiring 52 and a contact area between the second electrode 17 and the second wiring 53 is 10000 μm² or more. In the fixed state, a part of the first wiring 52 is exposed such that a terminal 81 of a connector 80 to be described later can come into contact therewith (FIGS. 7 and 8).

[Mounting State of Photodetection Module]

Figure 9:
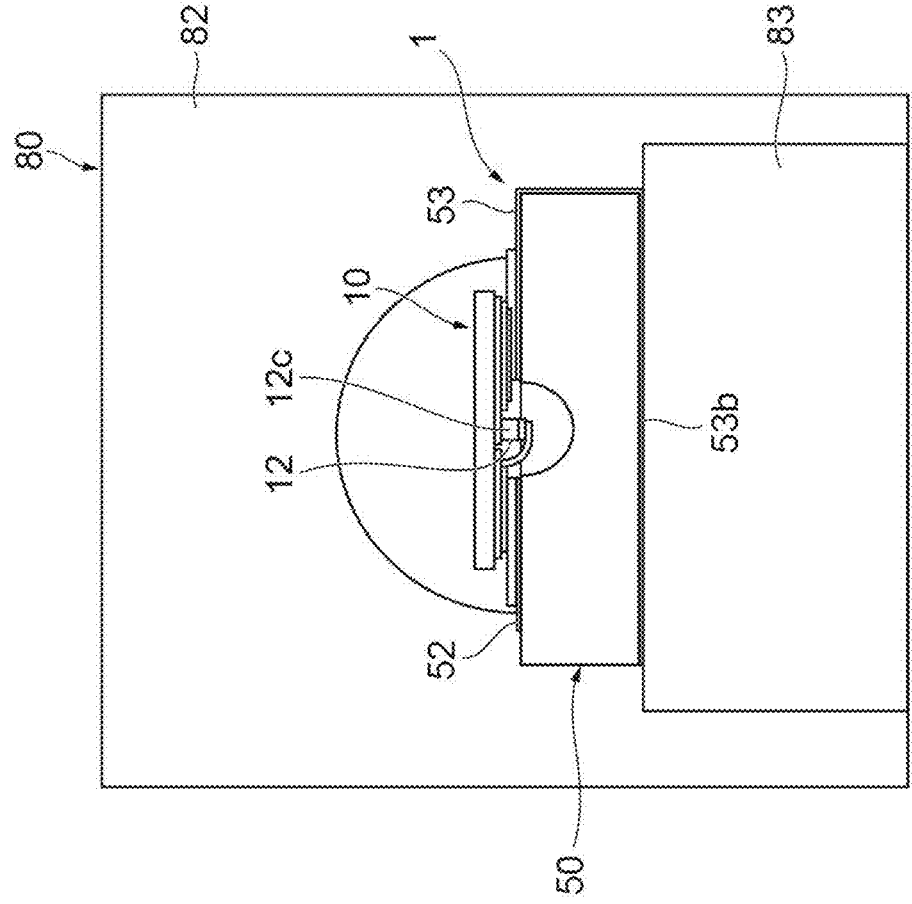
FIG. 9 is a front view showing a mounting state of the photodetection module.

As shown in FIGS. 7, 8, and 9, for example, the photodetection module 1 is used by being connected to the connector 80. The connector 80 is, for example, a SMA connector and includes the terminal 81 that is electrically connected to a signal wire of a SMA cable. The terminal 81 is mechanically connected to the first wiring 52 of the fixing member 50, and is electrically connected to the first wiring 52. Alternatively, the terminal 81 may be connected to the first wiring 52 by soldering. In such a manner, in this example, the first wiring 52 is a signal side wiring that is electrically connected to the signal wire.

The connector 80 further includes a body member 82 and a support member 83 that is integrally formed with the body member 82. The body member 82 and the support member 83 are electrically connected to a ground wire of the SMA cable. The photodetection module 1 is fixed to the connector 80 by connecting the fixing member 50 to the support member 83. For example, the second portion 53*b* of the second wiring 53 of the fixing member 50 is connected to a gold layer formed on a surface of the support member 83 by soldering. For example, the gold layer is formed to cover the entire surface of the support member 83. Alternatively, the body member 82 may be configured separately from the support member 83. In this case, the support member 83 to which the fixing member 50 is connected may be fixed to the body member 82 by screwing or by soldering. The second wiring 53 is electrically connected to the ground wire by the above-described connection. Namely, in this example, the second wiring 53 is a ground side wiring that is electrically connected to the ground wire. In this example, electrical connection between the photodetector 10 and the connector 80 is realized without using bonding wires (wireless connection). Accordingly, the generation of inductance caused by the bonding wires can be avoided. In addition, when bonding wires are used, the wires may be damaged by impact, being caught, or the like, and thus care must be taken in handling the device. In contrast, in this example, since bonding wires are not used, the handling of the device can be facilitated.

A shape (wiring pattern) of the first wiring 52 is set in consideration of impedance matching. In this example, the first wiring 52 is configured as a microstrip line. As one example, when a thickness of the insulating substrate 51 is 0.5 mm, a dielectric constant of the insulating substrate 51 is 9.8, a thickness of the first wiring 52 is 0.8 and a matching resistance value at 20 GHz is 50Ω, a width W of the first wiring 52 is set to 0.5 mm or less, and a length L5 of the first wiring 52 is set to 1.45 mm or less (FIG. 6). Accordingly, the length L5 of the first wiring 52 is ¼ or less of a wavelength (electrical length) of an electrical signal propagating through the first wiring 52. In such a manner, impedance matching in a desired frequency band can be realized by setting the length L5 of the first wiring 52 to ¼ or less of an electrical length calculated based on design parameters of the first wiring 52. Incidentally, the first wiring 52 may be configured as a coplanar line instead of a microstrip line.

As shown in FIG. 8, the photodetection module 1 (photodetector 10) further includes a lens 40. The lens 40 is disposed to face the end surface 12c of the mesa portion 12 that is a light incident surface, and converges the detection light DL toward the end surface 12c to condense the detection light DL on the end surface 12c. A numerical aperture (NA) of the lens 40 is, for example, 0.4 or more, and a condensed light diameter is several μm to several tens of μm. A low reflection layer including a dielectric multilayer film may be formed on both surfaces of the lens 40 and the end surface 12c. In this case, a transmittance of these surfaces for light in a sensitivity wavelength range of the photodetector 10 can be 95% or more.

[Functions and Effects]

In the photodetector 10, the first contact layer 13 and the first electrode 15 are connected to each other by the air bridge wiring 16. Accordingly, for example, compared to when the first contact layer 13 and the first electrode 15 are connected to each other by wire bonding, a wiring length can be shortened, and an area of the mesa portion 12 in a plan view can be reduced. In the case of wire bonding, an area required for a wiring is determined from an area required for crimping a tip of a wire, and for example, an area of approximately 100 μm×100 μm is required. Inductance can be reduced by shortening the wiring length, and response speed can be increased. In addition, parasitic capacitance can be reduced by reducing the area of the mesa portion 12, and thus the response speed can also be increased. On the other hand, when the area of the mesa portion 12 is simply reduced, it is concerned that output signal intensity decreases. In this respect, in the photodetector 10, when viewed in the Z direction (direction perpendicular to the major surface 11a of the semiconductor substrate 11), the length L1 of the mesa portion 12 in the optical waveguide direction A (Y direction) is longer than the length L2 of the mesa portion 12 in the X direction (direction perpendicular to the optical waveguide direction A). Accordingly, a path along which the detection light DL travels through the mesa portion 12 can be lengthened, and light can be effectively absorbed in the mesa portion 12. As a result, even when the area of the mesa portion 12 is reduced, output signal intensity can be ensured. Further, in the photodetector 10, the air bridge wiring 16 is led out from the first contact layer 13 to the one side in the X direction, and is bridged between the first contact layer 13 and the first electrode 15. Accordingly, a width (length in the optical waveguide direction A) of the air bridge wiring 16 can be ensured. When the wiring width is wide, a cross-sectional area increases, so that inductance can be further reduced and strength of the air bridge wiring 16 can be ensured to ensure reliability. Therefore, according to the photodetector 10, increasing response speed, ensuring output signal intensity, and ensuring reliability can be realized.

Figure 10:
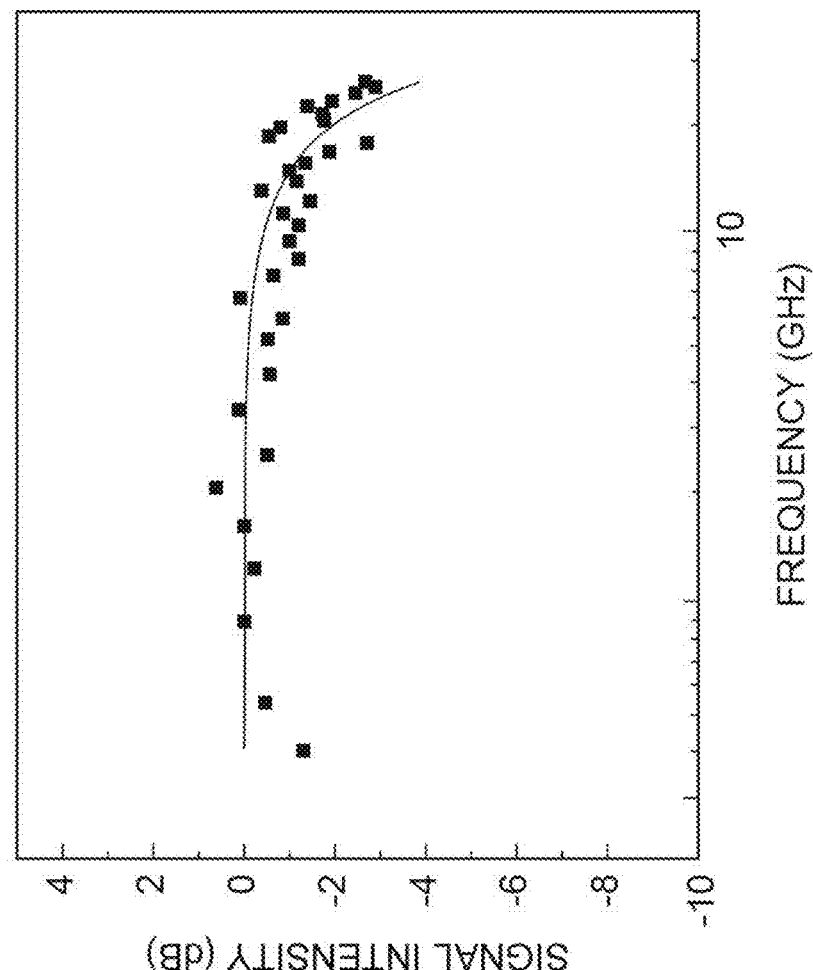
FIG. 10 is a graph showing a response characteristic of the photodetector.
Figure 11:
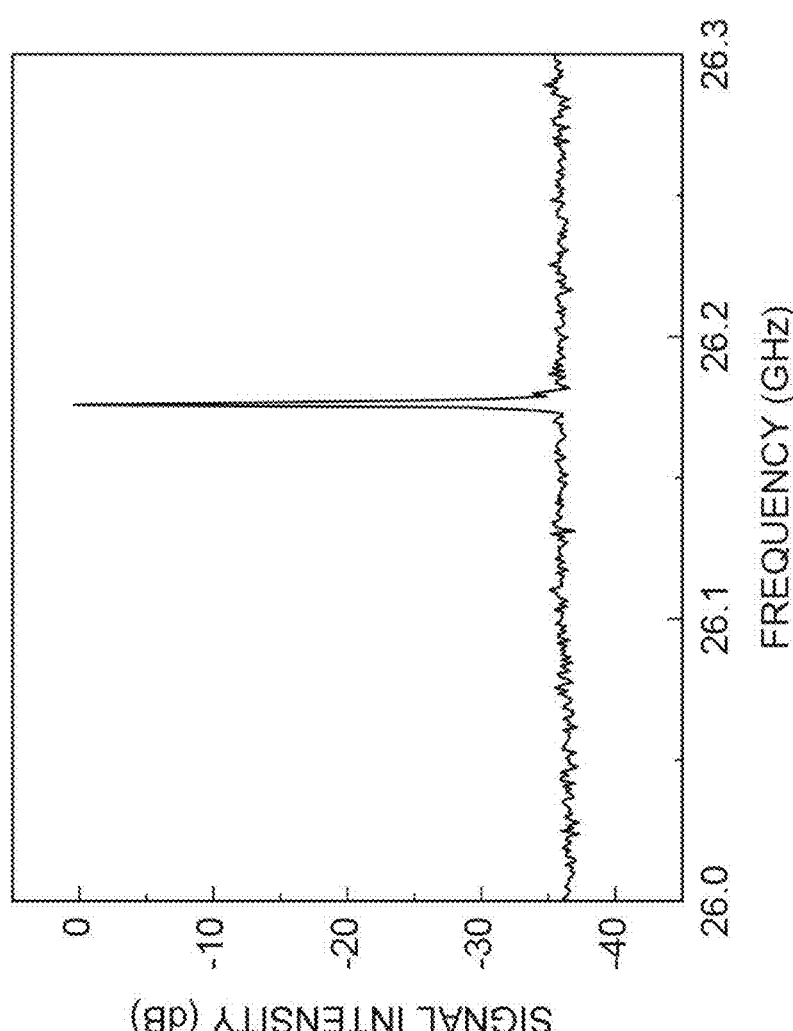
FIG. 11 is a graph showing an example of an output signal n a high frequency region.

FIG. 10 is a graph showing a response characteristic of the photodetector 10, and FIG. 11 is a graph showing an example of an output signal in a high frequency region. As shown in FIG. 10, in the photodetector 10, a cutoff frequency that is a frequency when signal intensity decreases to −3 dB is 20 GHz or higher. For example, in an MCT (HgCdTe) sensor used as a mid-infrared photodetector, only a cutoff frequency of approximately several hundreds of MHz (approximately 1 GHz at its maximum) can be realized. In contrast, in the photodetector 10, the cutoff frequency can be increased, and the response speed can be increased. In addition, as shown in FIG. 11, a high signal intensity higher than 30 dB is obtained in a frequency band higher than 26 GHz.

The first electrode 15 includes the connection portion 15a located on the one side in the X direction with respect to the mesa portion 12, and the air bridge wiring 16 is led out from the first contact layer 13 to the one side in the X direction and is connected to the connection portion 15a of the first electrode 15. Accordingly, the air bridge wiring 16 can be led out from the first contact layer 13 to the one side in the X direction, and the width of the air bridge wiring 16 can be certainly ensured.

The air bridge wiring 16 includes the bridge portion 16a extending in air, and the length L3 of the bridge portion 16a in the optical waveguide direction A is longer than the length L4 of the bridge portion 16a in the X direction. Accordingly, the width of the bridge portion 16a (air bridge wiring 16) can be certainly ensured.

Each of the length L1 of the mesa portion 12 in the optical waveguide direction A and the length L3 of the bridge portion 16a in the optical waveguide direction A is 50 μm or more. Accordingly, the width of the bridge portion 16a can be certainly ensured. In addition, the length of the mesa portion 12 in the optical waveguide direction A can be ensured, and light can be more effectively absorbed in the mesa portion 12.

The ratio of the length L1 to the length L2 of the mesa portion 12 is greater than 1 and less than 100. Accordingly, the length L1 of the mesa portion 12 in the optical waveguide direction A can be ensured, and light can be more effectively absorbed in the mesa portion 12.

The ratio of the length L3 to the length L4 of the bridge portion 16a is greater than 1 and less than 50. Accordingly, the width of the bridge portion 16a (air bridge wiring 16) can be certainly ensured.

The thickness of the bridge portion 16a is equal to or more than 1 μm and equal to or less than 10 μm. Accordingly, reliability can be certainly ensured. Namely, a shape of the bridge portion 16a and mechanical strength for maintaining the shape can be ensured by setting the thickness of the bridge portion 16a to 1 μm or more. In addition, the shape of the bridge portion 16a can be maintained against its own weight by setting the thickness of the bridge portion 16a to 10 μm or less.

The one end surface 12c of the mesa portion 12 in the optical waveguide direction A is an incident surface of the detection light DL. Accordingly, light can be more effectively absorbed in the mesa portion 12, and output signal intensity can be certainly ensured.

The one end surface 12c of the mesa portion 12 in the optical waveguide direction A is flush with the side surface 11b of the semiconductor substrate 11. Accordingly, the end surface 12c of the mesa portion 12 can be easily used as an incident surface of the detection light DL.

The photodetector 10 includes the lens 40 that is disposed to face the end surface 12c of the mesa portion 12, and that converges the detection light DL toward the end surface 12c of the mesa portion 12. Accordingly, a width (length in the X direction) of the end surface 12c of the mesa portion 12 can be narrowed, and the area of the mesa portion 12 in a plan view can be reduced. As a result, parasitic capacitance can be reduced, and the response speed can be further increased. In addition, when the area of the mesa portion 12 is assumed to be constant, the length of the mesa portion 12 in the optical waveguide direction A can be lengthened by narrowing the width of the mesa portion 12. As a result, light can be more effectively absorbed in the mesa portion 12, and output signal intensity can be certainly ensured. Even when the active layer 21 is thickened, absorption efficiency can be increased by increasing the number of cycles of the unit stacked bodies 24 in the active layer 21. An increase in the thickness of the active layer 21 contributes to reducing parasitic capacitance and also to reducing noise through an increase in element resistance. On the other hand, when the number of cycles is too large, quantum efficiency decreases, so that it is preferable that the number of cycles is approximately 10 to 150.

The side surfaces 12a of the mesa portion 12 in the X direction are exposed. Accordingly, the generation of parasitic capacitance can be suppressed, and the response speed can be further increased. Hereinafter, this point will be described with reference to FIGS. 12A and 12B.

Figures 12A, 12B:
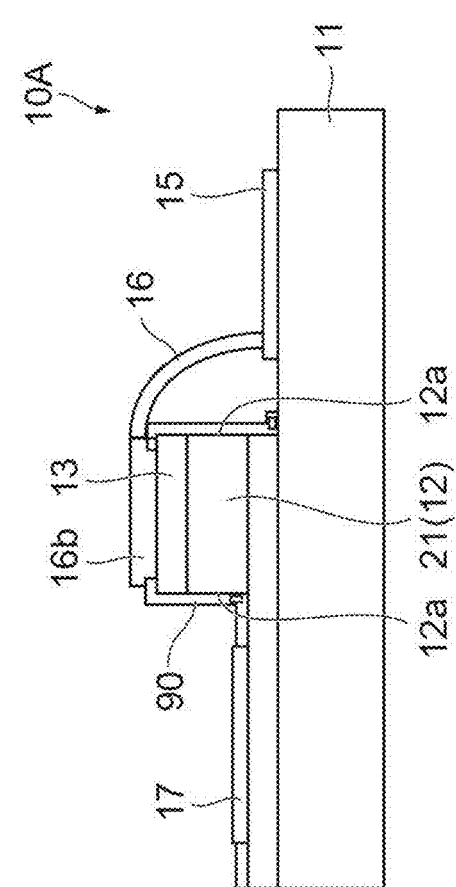
FIG. 12A is a front view of the photodetector of the embodiment.
FIG. 12B is a front view of a photodetector of a first modification example.

FIG. 12A is a front view of the photodetector 10, and FIG. 12B is a front view of a photodetector 10A of a first modification example. As shown in FIG. 12A, in the photodetector 10, both the side surfaces 12a of the mesa portion 12 in the X direction are exposed. In contrast, as shown in FIG. 12B, in the photodetector 10A, both the side surfaces 12a of the mesa portion 12 are covered with an insulating layer 90. The insulating layer 90 is, for example, a silicon nitride (SiN) film. The insulating layer 90 enters between the first contact layer 13 and a metal layer (the portion 16b of the air bridge wiring 16) on the first contact layer 13. Since the portion has a structure where an insulator is sandwiched between metals, for example, when misalignment occurs during formation of the insulating layer 90, there is a possibility that a small parasitic capacitance is generated in the portion. In this respect, in the photodetector 10, since both the side surfaces 12a of the mesa portion 12 are exposed, the generation of such parasitic capacitance can be suppressed.

In a plan view, the second contact layer 14 includes the first portion 14a located between the major surface 11a of the semiconductor substrate 11 and the mesa portion 12, and the second portion 14b located outside the mesa portion 12, and the second electrode 17 is formed on the second portion 14b. Accordingly, a large area of the second electrode 17 can be ensured, and a connection member can be well connected to the second electrode 17. For example, in the above-described example, the second wiring 53 is electrically connected to the second electrode 17 in a surface contact state. Accordingly, for example, compared to when the second electrode 17 and the second wiring 53 are connected to each other by wire bonding, inductance can be reduced, and the response speed can be further increased. In addition, since the second electrode 17 and the second wiring 53 are connected to each other in a surface contact state, the photodetector 10 and the fixing member 50 can be firmly fixed, and reliability can be certainly ensured. In addition, since the area of the second electrode 17 is large, a large contact area between the second electrode 17 and the second wiring 53 can be ensured. Incidentally, the connection member connected to the second electrode 17 may be a ribbon-shaped electrode or a bonding wire. Even in such a case, since the area of the second electrode 17 is large, the connection member can be well connected to the second electrode 17.

In the photodetection module 1, the first electrode 15 on the semiconductor substrate 11 in the photodetector 10 is electrically connected to the first wiring 52 in a state where the first electrode 15 is in surface contact with the first wiring 52 on the insulating substrate 51 in the fixing member 50 (surface-to-surface connected). Accordingly, for example, compared to when the first electrode 15 and the first wiring 52 are connected to each other by wire bonding, the generation of inductance caused by wires can be avoided, and inductance can be reduced. As a result, the response speed can be increased. In addition, since the first electrode 15 and the first wiring 52 are connected to each other in a surface contact state, the photodetector 10 and the fixing member 50 can be firmly fixed, and reliability can be ensured. Further, in the photodetection module 1, at least a part of the mesa portion 12 of the photodetector 10 is disposed inside the recessed portion 54 formed in the insulating substrate 51. Accordingly, the mesa portion 12 that is delicate can be protected, and reliability can be ensured. For example, the mesa portion 12 can be protected from damage caused by external contact, the attachment of floating matter, air pressure, or the like (mechanical damage caused by external factors).

The recessed portion 54 is open on the side surface 51c of the insulating substrate 51. Accordingly, the detection light can be easily incident on the end surface 12c of the mesa portion 12 in the Y direction. At least a part of the air bridge wiring 16 is disposed inside the recessed portion 54. Accordingly, the air bridge wiring 16 that is delicate can be protected, and reliability can be certainly ensured. The first wiring 52 has a length of ¼ or less of a wavelength of an electrical signal propagating through the first wiring 52. Accordingly, impedance matching can be realized. The mesa portion 12 is separated from the inner surface of the recessed portion 54. Accordingly, the mesa portion 12 can be certainly protected. When the photodetector 10 is a detector that detects the detection light DL using intersubband absorption in the quantum well structure, detection can be performed without applying an external voltage, so that heat is unlikely to be generated in the mesa portion 12. For this reason, the mesa portion 12 can be separated from the insulating substrate 51.

The first electrode 15 is in surface contact with the first wiring 52 with the solder layer 55 sandwiched therebetween, and the second electrode 17 is in surface contact with the second wiring 53 with the solder layer 56 sandwiched therebetween. Accordingly, the first electrode 15 and the first wiring 52 can be electrically and mechanically firmly connected to each other, and the second electrode 17 and the second wiring 53 can be electrically and mechanically firmly connected to each other. In addition, when the first electrode 15 and the first wiring 52 are connected to each other and the second electrode 17 and the second wiring 53 are connected to each other, even in a case where there is a height difference between the first electrode 15 and the second electrode 17, the height difference can be absorbed by the solder layers 55 and 56, and good surface contact at each connection location can be realized.

[Modification Examples]

Figure 13:
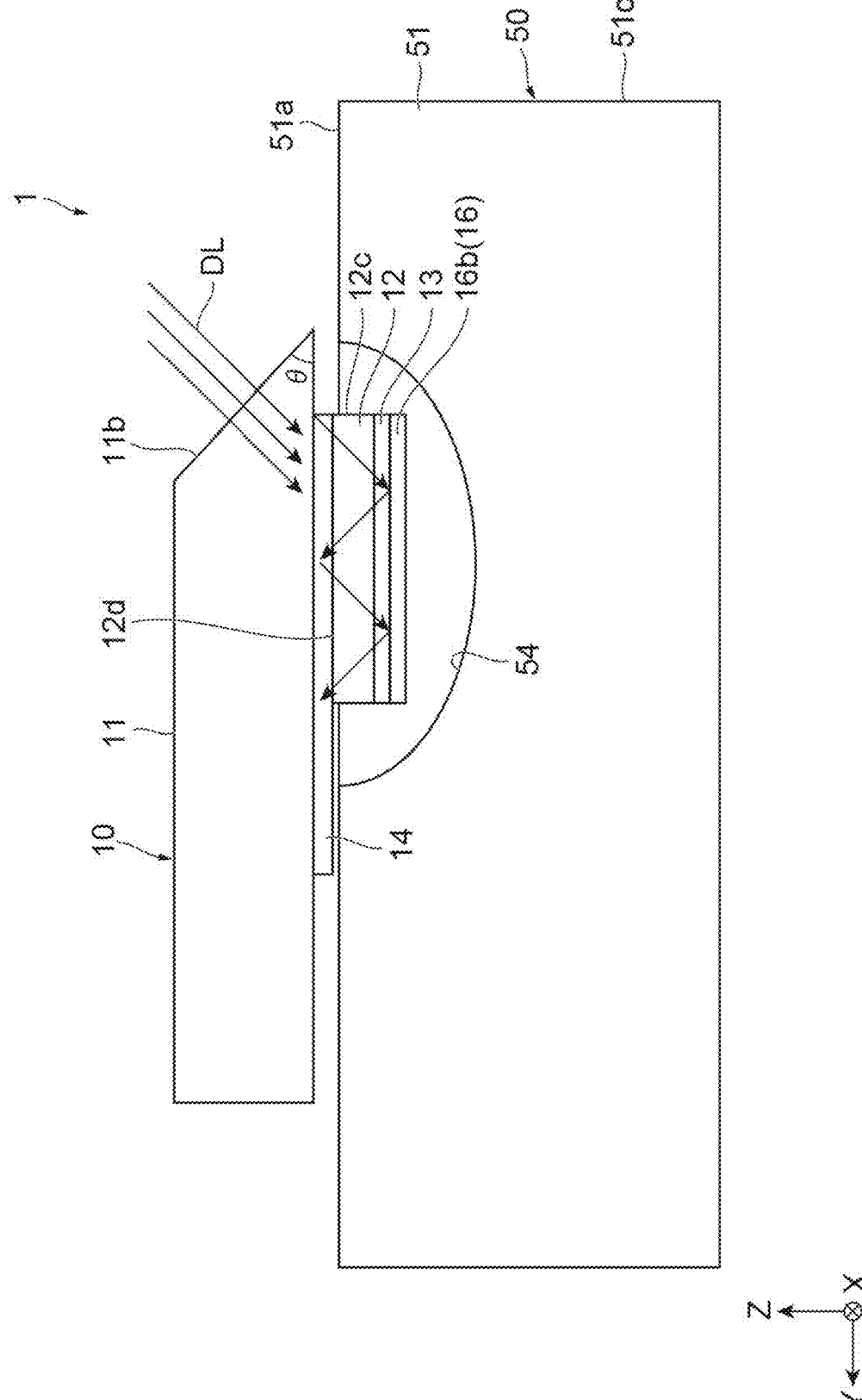
FIG. 13 is a cross-sectional view of a photodetection module according to a second modification example.
Figure 14:
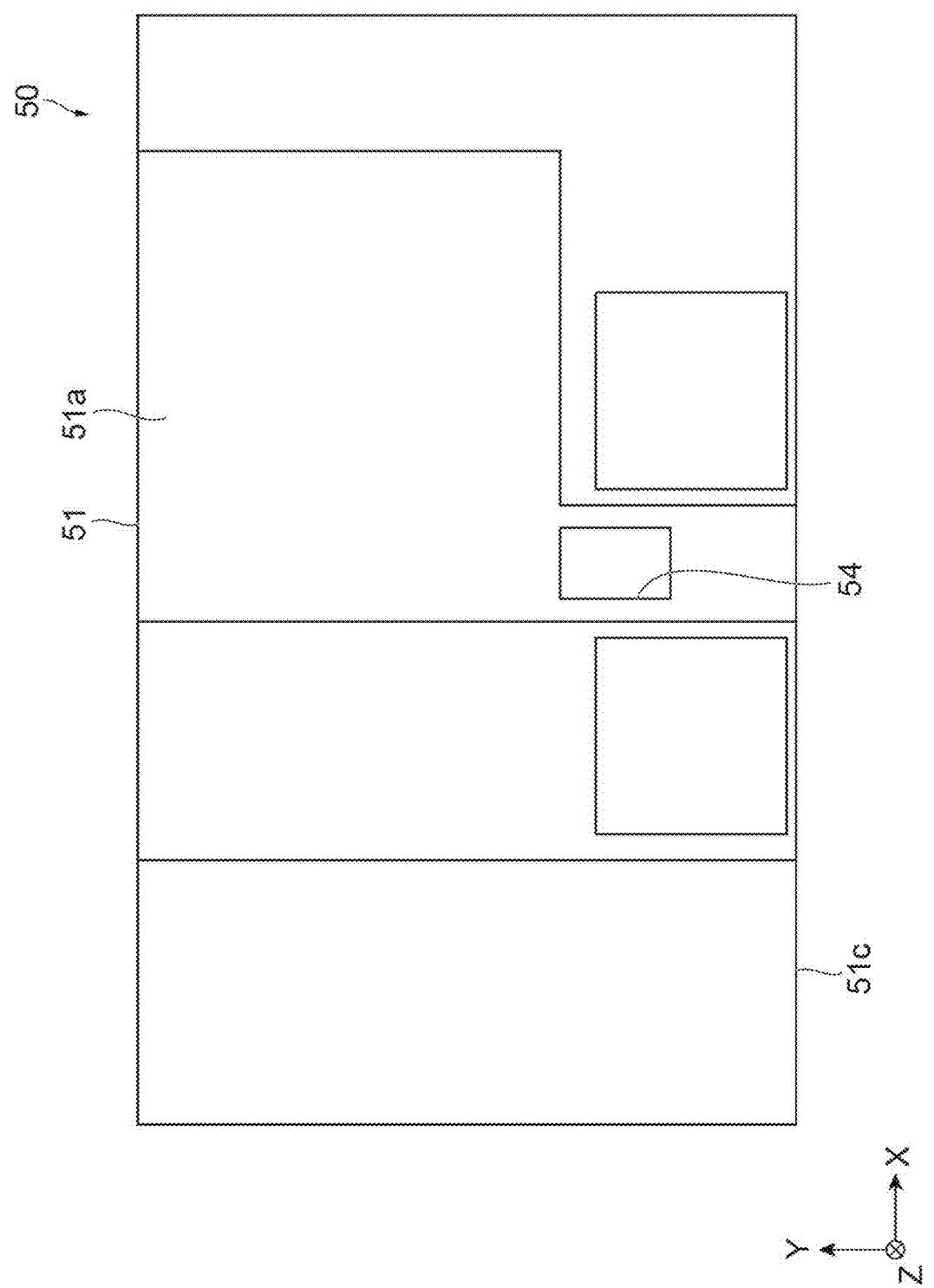
FIG. 14 is a plan view of a fixing member according to the second modification example.

In the photodetection module 1 of a second modification example shown in FIGS. 13 and 14, the detection light DL travels through the semiconductor substrate 11, and then is incident on the mesa portion 12. In the second modification example, the side surface 11b of the semiconductor substrate 11 is an inclined surface inclined with respect to the Z direction. As one example, an inclination angle θ of the side surface 11b with respect to the Z direction when viewed in the X direction is 45 degrees. The side surface 11b is a polished surface formed, for example, by polishing. The detection light DL is incident on the side surface 11b in a direction perpendicular to the side surface 11b, travels through the semiconductor substrate 11, and then is incident on a surface 12d of the mesa portion 12 through the second contact layer 14. The surface 12d is a surface on a semiconductor substrate 11 side of the mesa portion 12. Namely, in this example, the side surface 11b is an incident surface of the detection light DL. The end surface 12c of the mesa portion 12 is not flush with the side surface 11b of the semiconductor substrate 11. The detection light DL incident on the mesa portion 12 is multiply reflected inside the mesa portion 12, and an electric field vibrational component of the detection light DL that is parallel to the Z direction is absorbed in the active layer 21. The detection light DL may be multiply reflected inside the semiconductor substrate 11, and incident on the surface 12d of the mesa portion 12 a plurality of times. Incidentally, in FIG. 13, the first electrode 15 and the like are omitted and hatching indicating a cross section is omitted.

As shown in FIG. 14, in the second modification example, the recessed portion 54 is configured as a hole formed in the major surface 51a of the insulating substrate 51. The recessed portion 54 is not open on the side surface 51c of the insulating substrate 51 and is separated from an outer edge of the major surface 51a. The recessed portion 54 has a substantially semicircular shape in a cross section perpendicular to the X direction. In the second modification example, at least a part of the mesa portion 12 is also disposed inside the recessed portion 54. The mesa portion 12 is formed in a shape that allows the mesa portion 12 to be disposed inside the recessed portion 54. In the second modification example as described above, similarly to the above embodiment, increasing response speed, ensuring output signal intensity, and ensuring reliability can also be realized. In addition, since the recessed portion 54 is configured as a hole that is not open in the side surface 51c of the insulating substrate 51, the mesa portion 12 can be more certainly protected.

Figure 15:
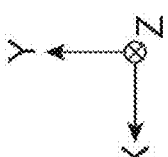
FIG. 15 is a plan view of a photodetector according to a third modification example.

In a third modification example shown in FIG. 15, the photodetector 10 includes a height adjustment layer 19. The height adjustment layer 19 is formed in a planar shape on the major surface 11a of the semiconductor substrate 11. The height adjustment layer 19 is formed on the major surface 11a to be separated from the second contact layer 14, and is electrically isolated from the second contact layer 14. The height adjustment layer 19 is formed simultaneously with the formation of the second contact layer 14, and has the same configuration as that of the second contact layer 14. Namely, the height adjustment layer 19 has the same thickness as that of the second contact layer 14. The first electrode 15 is formed on the height adjustment layer 19. In the third modification example as described above, similarly to the above embodiment, increasing response speed, ensuring output signal intensity, and ensuring reliability can also be realized. In addition, when the first electrode 15 and the first wiring 52 are connected to each other and the second electrode 17 and the second wiring 53 are connected to each other, even in a case where there is a height difference between the first electrode 15 and the second electrode 17, the height difference between the first electrode 15 and the second electrode 17 can be reduced by the height adjustment layer 19, and good surface contact at each connection location can be realized.

The present disclosure is not limited to the above embodiment. For example, the material and the shape of each configuration are not limited to the material and the shape described above, and various materials and shapes can be adopted. The length L3 of the bridge portion 16a in the optical waveguide direction A may not necessarily be longer than the length L4 of the bridge portion 16a in the X direction. The lens 40 may be omitted. The second contact layer 14 may include only the first portion 14a without including the second portion 14b. The mesa portion 12 may further include an upper cladding layer disposed between the active layer 21 and the first contact layer 13, and a lower cladding layer disposed between the active layer 21 and the second contact layer 14.

In the above embodiment, the air bridge wiring 16 is led out from the first contact layer 13 in the direction parallel to the X direction, but it is sufficient as long as the air bridge wiring 16 is led out from the first contact layer 13 to the one side in the X direction, and the air bridge wiring 16 may be led out from the first contact layer 13 in a direction inclined with respect to the X direction and to the Y direction in a plan view. Namely, the air bridge wiring 16 may be led out from the first contact layer 13 in a direction intersecting the Y direction in a plan view.

In the above embodiment, the photodetector 10 is configured as a quantum cascade detector, but the photodetector 10 may be configured as other photodetectors such as a quantum well infrared photodetector (QWIP). The quantum well infrared photodetector is an infrared photodetector that detects light using intersubband absorption in a quantum well structure.

[Beating Spectroscopy Device]

Figure 16:
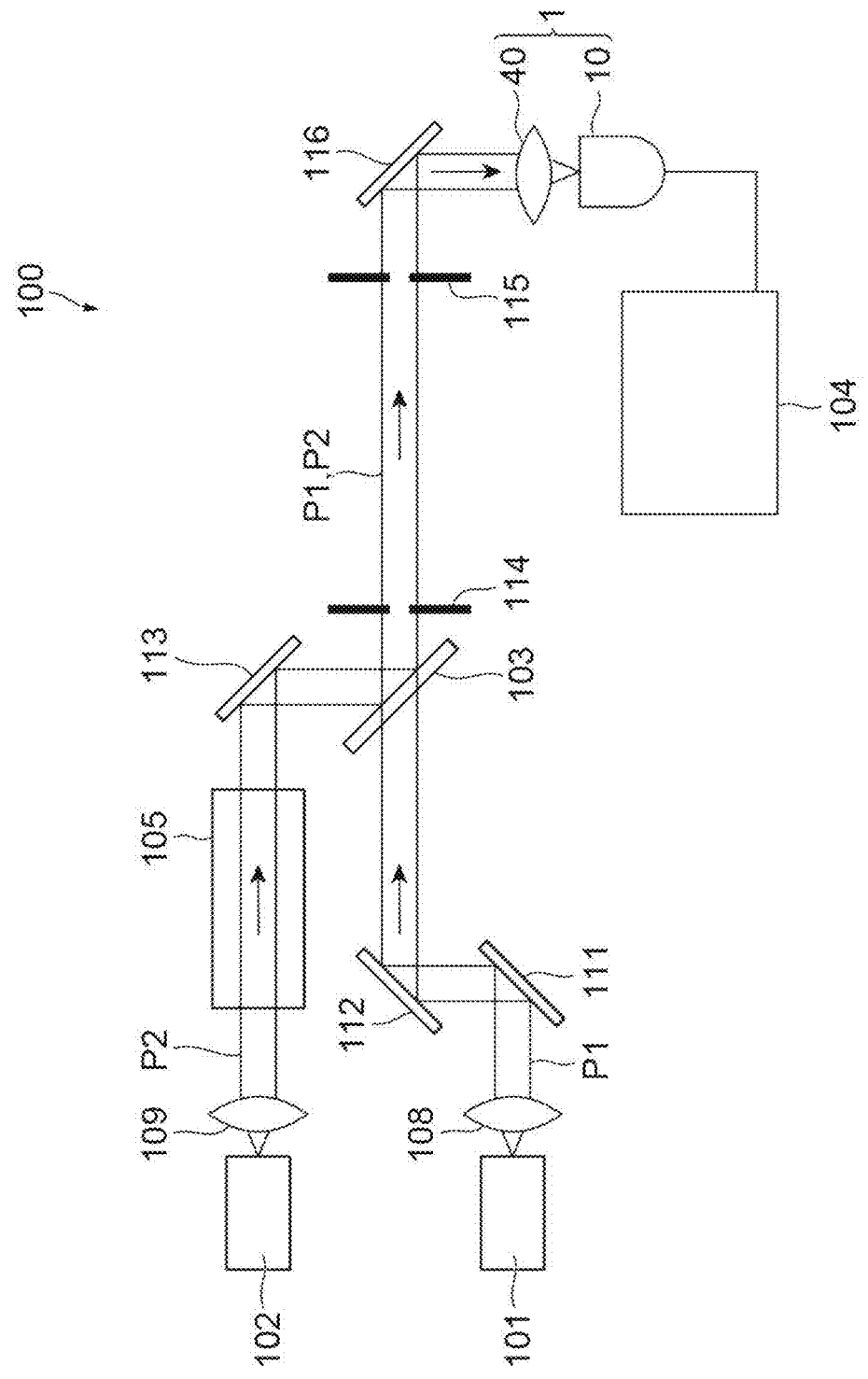
FIG. 16 is a view showing a configuration of a beating spectroscopy device.

As shown in FIG. 16, a beating spectroscopy device 100 includes a first light source (fixed wavelength light source) 101, a second light source (variable wavelength light source) 102, a beam splitter 103, the photodetection module 1, a spectrum analyzer 104, and a gas cell 105. In the beating spectroscopy device 100, light P1 from the first light source 101 and light P2 from the second light source 102 are detected by the photodetection module 1 while the wavelength of the light P2 is changed to scan a frequency of a beating signal having a frequency in accordance with a wavelength difference between the lights P1 and P2. Accordingly, heterodyne detection spectroscopy can be performed.

The first light source 101 and the second light source 102 output the lights P1 and P2 having oscillation wavelengths that are included in a sensitivity wavelength range of the photodetection module 1 and that are close to each other. The first light source 101 and the second light source 102 are, for example, distributed feedback quantum cascade lasers (DFB-QCL). During use, the oscillation wavelength of the first light source 101 is fixed and the oscillation wavelength of the second light source 102 is modulated. For example, the oscillation wavelength of the second light source 102 can be modulated by changing an injection current. Namely, the first light source 101 is a fixed wavelength light source that outputs the light P1 with a fixed wavelength, and the second light source 102 is a variable wavelength light source that outputs the light P2 with a variable wavelength. An operation of the second light source 102 is controlled by a control unit formed of, for example, a computer.

Figure 17:
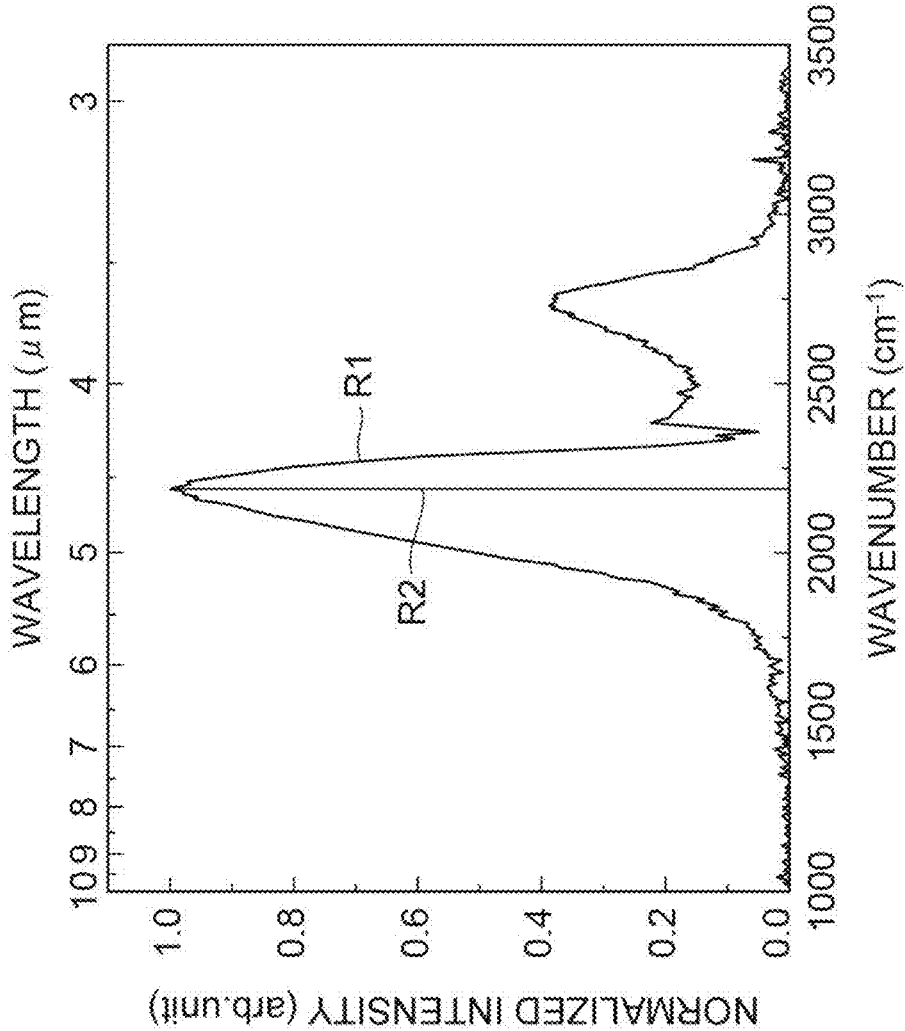
FIG. 17 is a graph showing a sensitivity characteristic of the photodetector and an oscillation wavelength of a fixed wavelength light source.
Figure 18:
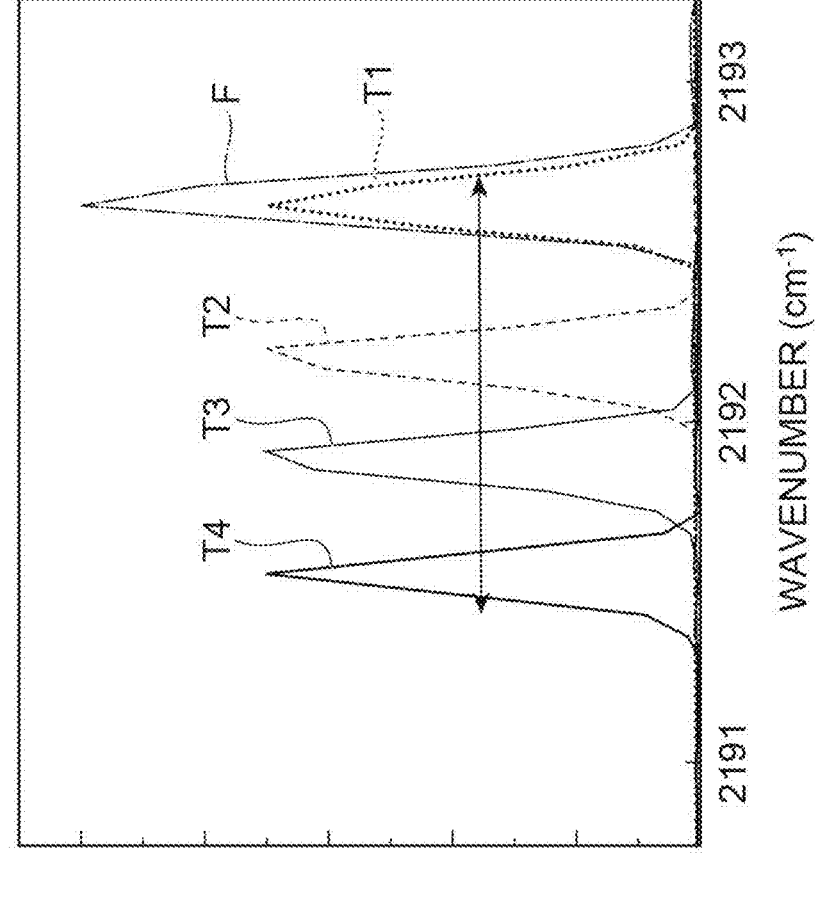
FIG. 18 is a graph showing oscillation wavelengths of the fixed wavelength light source and of a variable wavelength light source.

In FIG. 17, a sensitivity characteristic of the photodetector 10 is indicated by reference sign R1, and an oscillation wavelength of the second light source 102 is indicated by reference sign R2. As shown in FIG. 17, the oscillation wavelength of the second light source 102 is included in the sensitivity wavelength range of the photodetector 10. FIG. 18 is a graph showing oscillation wavelengths of the first light source 101 and of the second light source 102. Reference sign F indicates an oscillation wavelength of the first light source 101 when the injection current is 780 mA. Reference signs T1 to T4 indicate oscillation wavelengths of the second light source 102 when the injection currents are 780 mA, 810 mA, 830 mA, and 850 mA, respectively. In such a manner, the oscillation wavelength of the second light source 102 can be modulated by changing the injection current.

The light P1 from the first light source 101 passes through a lens 108, and then is reflected by mirrors 111 and 112 and is incident on the beam splitter 103. The light P2 from the second light source 102 passes through a lens 109, and then is reflected by a mirror 113 and is incident on the beam splitter 103. The lights P1 and P2 are combined by the beam splitter 103. The combined lights P1 and P2 pass through aperture members (irises) 114 and 115, and then are reflected by a mirror 116, are incident on the lens 40, and are incident on the photodetector 10. The spectrum analyzer 104 is connected to the photodetector 10. The gas cell 105 that contains gas to be measured is disposed between the second light source 102 and the mirror 113. The light P2 from the second light source 102 passes through in the gas cell 105, and then is incident on the mirror 113. When a wavelength modulation range of the light P2 from the second light source 102 crosses an absorption line of the gas, light of a specific wavelength of the light P2 is absorbed.

The photodetector 10 detects a beating signal (beating) having a frequency in accordance with a wavelength difference between the light P1 from the first light source 101 and the light P2 from the second light source 102. It is difficult to directly measure a frequency of light. For example, when the wavelength is 4 μm, a response speed of the photodetector needs to be approximately 75 THz or higher. In contrast, in a beating spectroscopy method using a beating signal, for example, when the wavelength of the light P1 is 4.000 μm and the wavelength of the light P2 is 4.001 μm, the response speed of the photodetector 10 may be approximately 18 GHz or higher. As described above, in the photodetection module 1, a cutoff frequency of 20 GHz or higher is obtained. For this reason, spectroscopy can be performed over a wide wavelength range by performing beating spectroscopy using the photodetection module 1.

Figure 19:
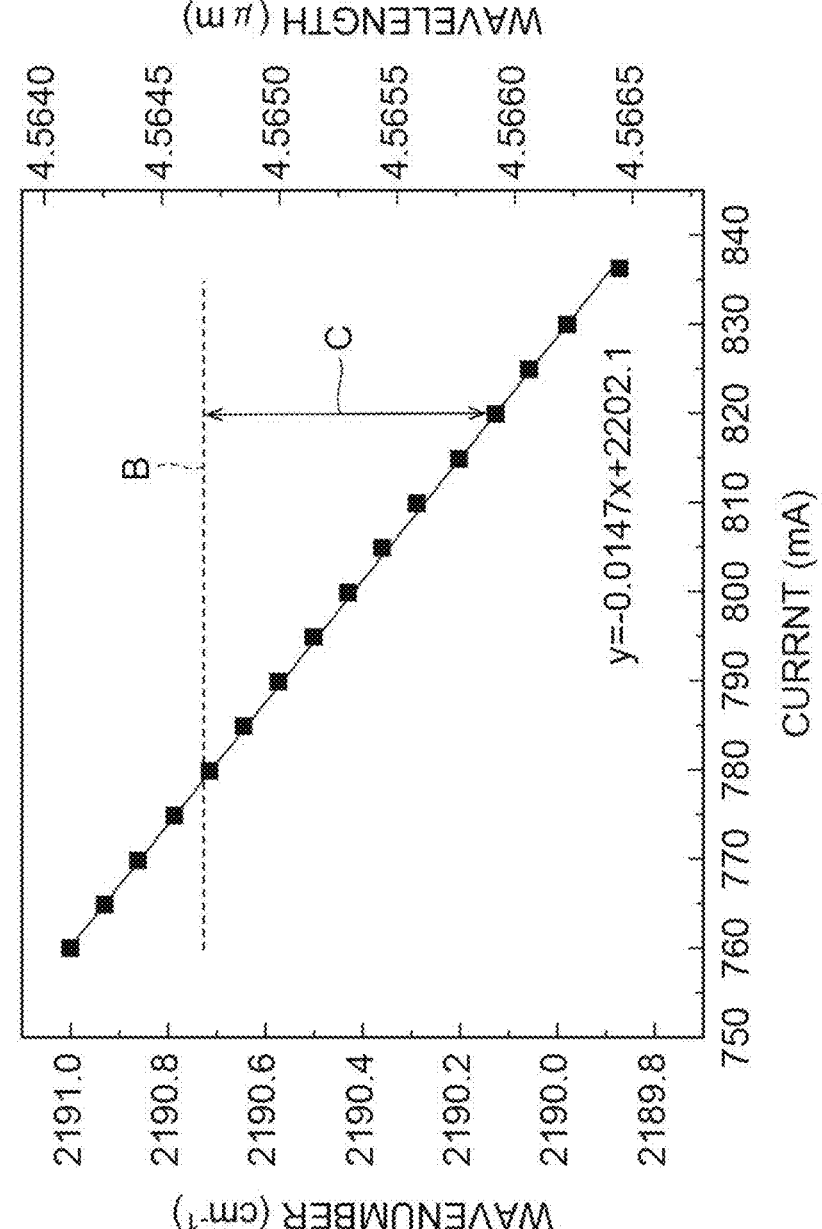
FIG. 19 is a graph showing a relationship between an injection current and an oscillation wavelength of the variable wavelength light source.

As described above, in the beating spectroscopy device 100, the lights P1 and P2 are detected by the photodetection module 1 while the wavelength of the light P2 is changed to scan the frequency of the beating signal. FIG. 19 is a graph showing a relationship between an injection current and an oscillation wavelength of the second light source 102. As shown in FIG. 19, when a current of the second light source 102 is x and a wavenumber of the light P2 from the second light source 102 is y, a relationship of y=0.0147x+2202.1 is established. Broken line B indicates an oscillation wavelength of the first light source 101 when the injection current is 750 mA. In this example, an operating temperature of each of the first light source 101 and the second light source 102 is 20° C., and both are driven by a continuous wave (CW). Reference sign C indicates a difference in oscillation wavelength between the first light source 101 and the second light source 102 at an injection current. The faster the response speed of the photodetector 10 is, the larger the difference can be, and a wavelength scanning range can be widened. FIG.

Figure 20:
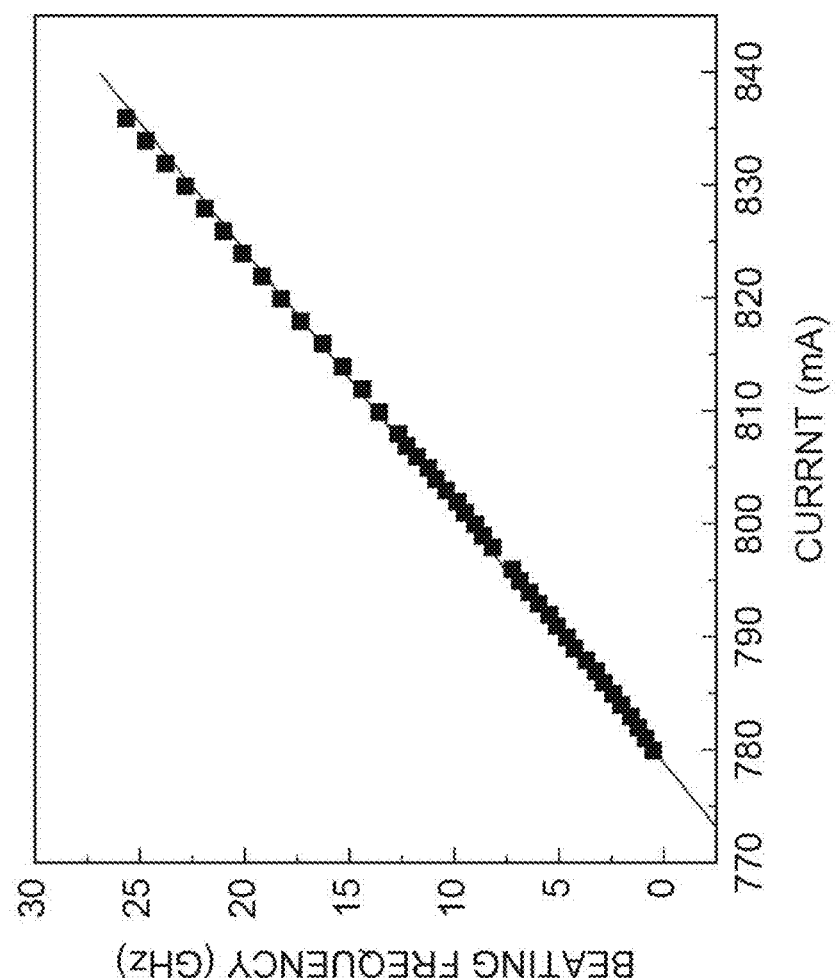
FIG. 20 is a graph showing a relationship between an injection current to the variable wavelength light source and a beating frequency.

20 is a graph showing a relationship between an injection current to the second light source 102 and a beating frequency. As shown in FIG. 20, the beating frequency increases linearly with an increase in the injection current.

Figure 21:
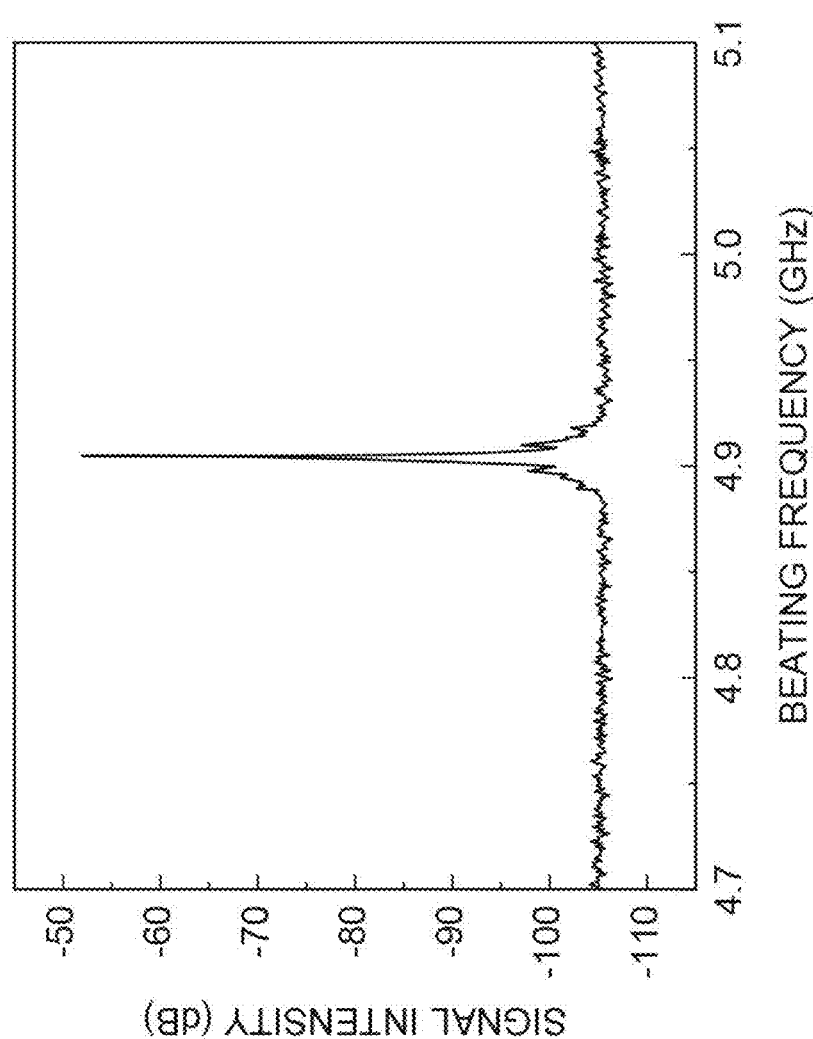
FIG. 21 is a graph showing an example of a beating signal.
Figure 22:
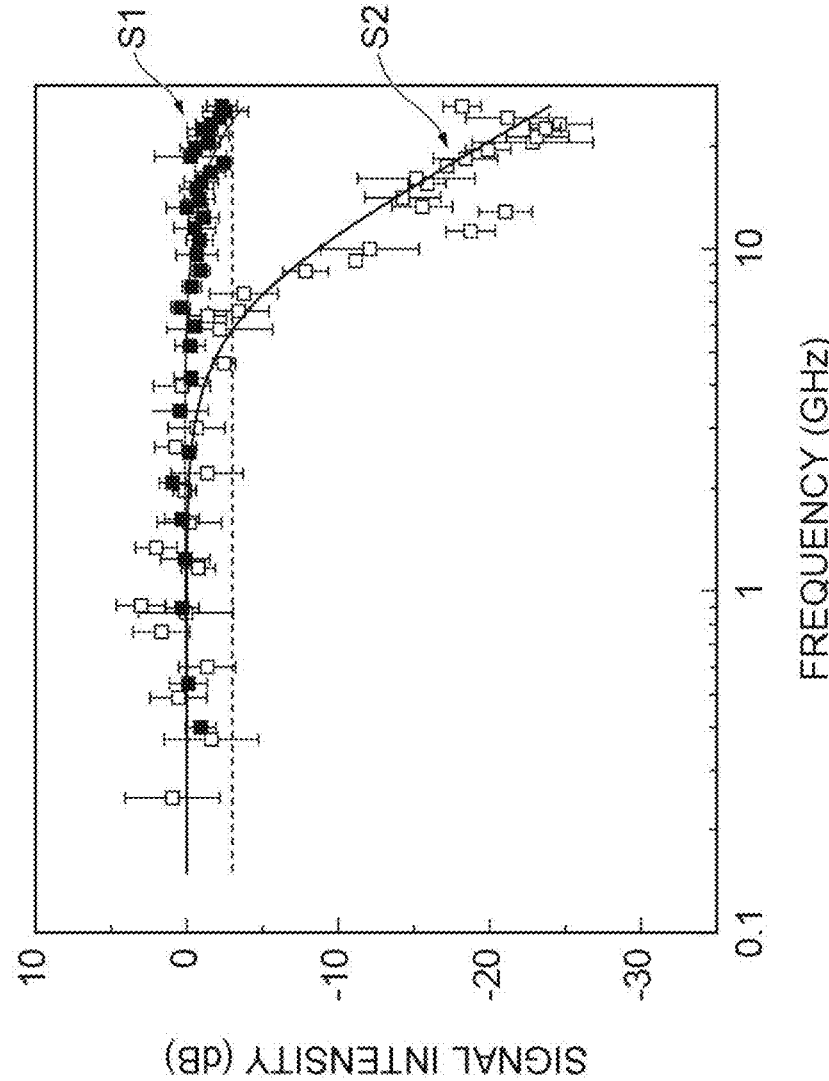
FIG. 22 is a graph showing a result of comparison of response characteristics.

FIG. 21 is a graph showing an example of a beating signal. FIG. 22 is a graph showing a result of comparison of response characteristics. In FIG. 22, reference sign S1 indicates a frequency response characteristic of the photodetection module 1, and reference sign S2 indicates a frequency response characteristic of a photodetector for comparison. It can be seen from FIG. 22 that in the photodetection module 1, the cutoff frequency is 20 GHz or higher and the response speed is increased compared to the photodetector for comparison.

Figure 23:
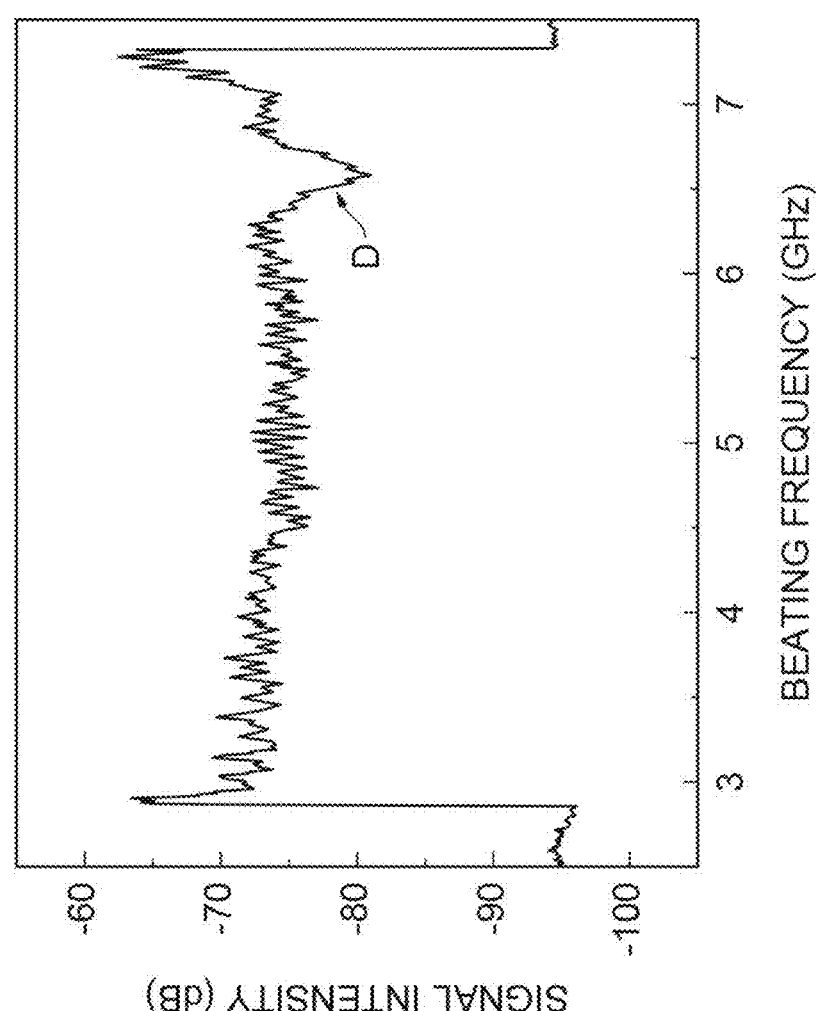
FIG. 23 is a graph showing a measurement result of beating spectroscopy.
Figure 24:
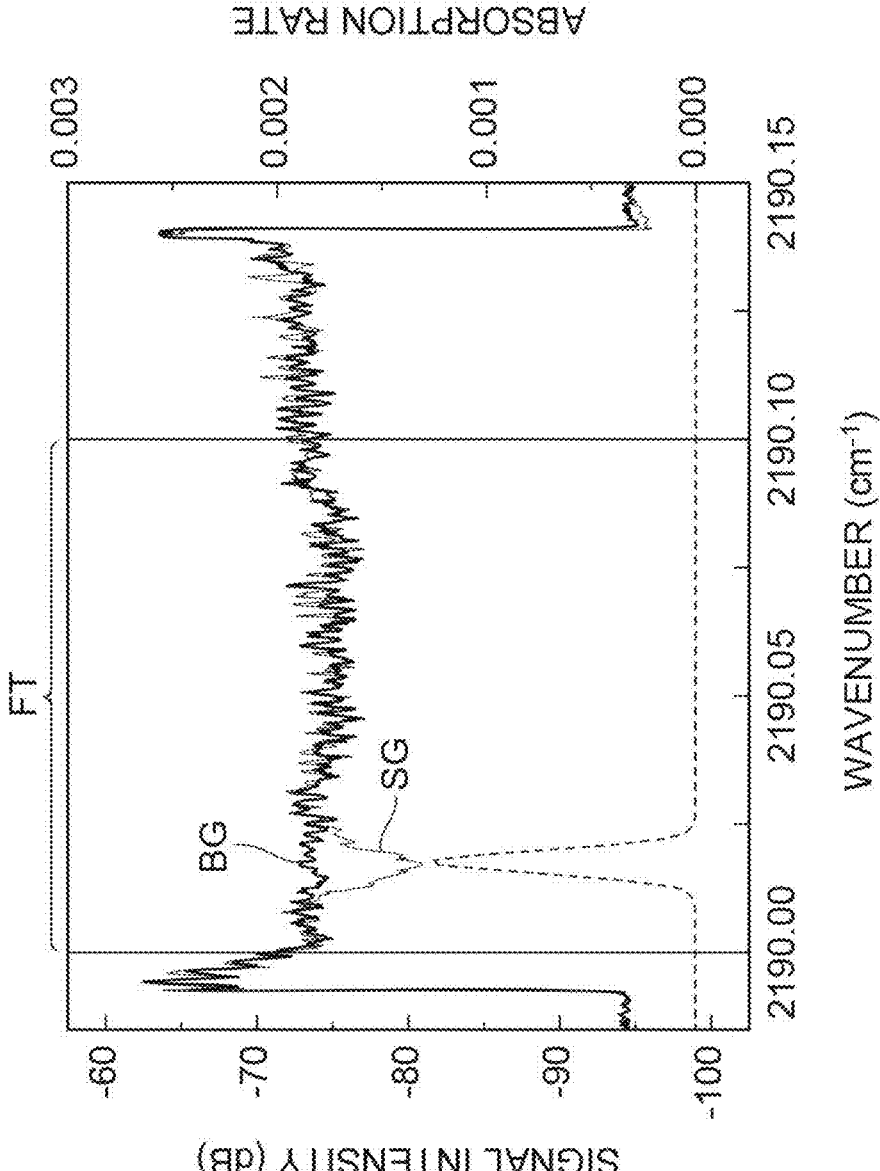
FIG. 24 is a graph showing a measurement result of beating spectroscopy.
Figure 25:
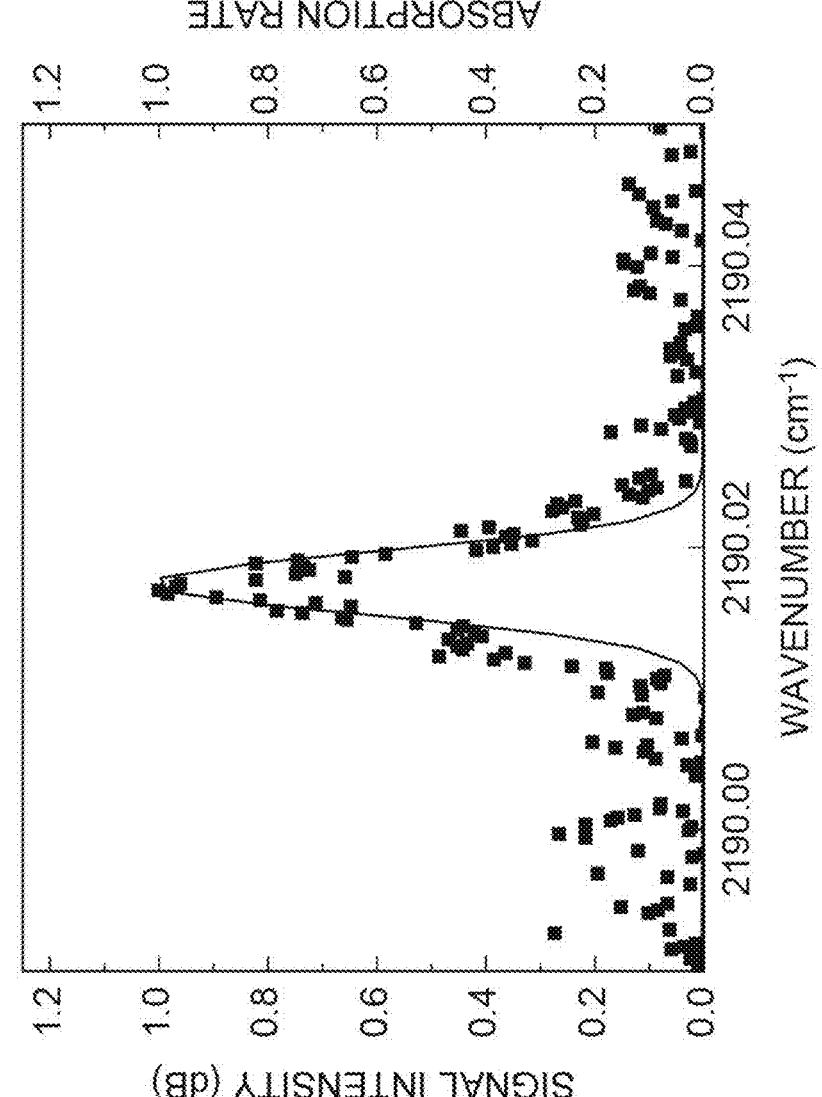
FIG. 25 is a graph showing a measurement result of beating spectroscopy.

FIGS. 23, 24, and 25 are graphs showing measurement results of beating spectroscopy. FIG. 23 is a graph showing an output signal of the spectrum analyzer 104, and FIG. 24 is a graph in which beating frequency on the horizontal axis of the graph shown in FIG. 23 is converted into wavelength. FIG. 25 is a graph obtained by subtracting a signal of background light from the output signal.

In this example, gas to be measured is carbon monoxide, and an absorption line in the vicinity of a wavenumber of 2190 cm$^{-1}$ is observed. When a wavelength scanning range crosses the absorption line of the gas to be measured, as indicated by arrow D in FIG. 23, the absorption of the gas dependent on the wavelength is observed. The reason is that when a wavelength of the light P2 from the second light source 102 coincides with an absorption wavelength of the gas, light intensity decreases due to the absorption. Intensity of the beating signal is proportional to a product of an electric field amplitude of the light P1 from the first light source 101 and an electric field amplitude of the light P2 from the second light source 102. For this reason, the intensity of the light P2 decreases, so that a dip as indicated by arrow D is observed. In FIG. 24, reference sign SG indicates an output signal when the gas cell 105 is charged with carbon monoxide, and reference sign BG indicates an output signal when there is no carbon monoxide inside the gas cell 105. In addition, an absorption spectrum of carbon monoxide is indicated by a broken line. Reference sign FT indicates one example of a resolution range of a Fourier transform infrared spectrometer (FTIR). A resolution of the FTIR is approximately 3 GHz (0.1 cm$^{-1}$), whereas a resolution of approximately 20 MHz can be obtained in the beating spectroscopy device 100. The resolution is 150 or more times the resolution of the FTIR. In such a manner, according to the beating spectroscopy device 100, the wavelength scanning range in beating spectroscopy can be widened.

In addition, in the beating spectroscopy device 100, the first light source 101 and the second light source 102 are quantum cascade lasers, and the photodetector 10 is a quantum cascade detector. Since output light of the quantum cascade laser is linearly polarized light parallel to a growth direction of the active layer, the first light source 101, the second light source 102, and the photodetector 10 are disposed such that polarization directions of the first light source 101 and of the second light source 102 coincide with a polarization direction to which the photodetector 10 is sensitive, the lights P1 and P2 from the first light source 101 and from the second light source 102 can be effectively absorbed in the active layer 21 of the photodetector 10. Further, in this case, polarization characteristics of the first light source 101 and of the second light source 102 and a polarization characteristic of the photodetector 10 function as polarization filters, so that an influence of background light having random polarization can be suppressed, and as a result, SN ratio can be improved.

[Fourth Modification Example]

FIG. 26 is a view showing a configuration of a beating spectroscopy device 100A according to a fourth modification example. The beating spectroscopy device 100A includes the first light source 101 (first quantum cascade laser), the second light source 102 (second quantum cascade laser), the beam splitter 103 (optical member), the photodetection module 1, the spectrum analyzer 104, and a gas cell 105A (sample holder). In addition, the beating spectroscopy device 100A further includes a first driver 121, a mirror 122, a function generator 123, a second driver 124, mirrors 125, 126, 128, and 129, a lens 130, and an isolator 131. Similarly to the beating spectroscopy device 100 described above, in the beating spectroscopy device 100A, the light P1 from the first light source 101 and the light P2 from the second light source 102 are detected by the photodetection module 1 while the wavelength of the light P2 is changed to scan a frequency of a beating signal having a frequency in accordance with a wavelength difference between the lights P1 and P2. Accordingly, heterodyne detection spectroscopy can be performed.

The first light source 101 is a quantum cascade laser, and is a fixed wavelength light source that outputs the light P1 with a fixed wavelength. The second light source 102 is a quantum cascade laser, and is a variable wavelength light source that outputs the light P2 with a variable wavelength. In this example, the first light source 101 is driven by the first driver 121, and the second light source 102 is driven by the second driver 124. The first driver 121 and the second driver 124 control the first light source 101 or the second light source 102 to output, for example, a continuous wave (CW). The function generator 123 capable of generating a ramp wave is electrically connected to the second light source 102. The second light source 102 is driven based on the ramp wave generated by the function generator 123, thereby changing the wavelength of the light P2 to be output from the second light source 102. In this example, the second driver 124 modulates an injection current to be injected to the second light source 102 in accordance with the ramp wave from the function generator 123, thereby modulating the oscillation wavelength of the second light source 102. An operating temperature of each of the first light source 101 and the second light source 102 is 10° C. or more and 40° C. or less (is room temperature). As one example, an operating temperature of the first light source 101 is 28° C., and an operating temperature of the second light source 102 is 27° C. An injection current of the first light source 101 is 625 mA, and at this time, a wavenumber of the light P1 is 2220.60 cm$^{-1}$. The injection current of the second light source 102 is changed in a range of 407 to 494 mA, and then the wavenumber of the light P2 is changed in a range of 2220.54 to 2219.72 cm$^{-1}$ (variation width is 0.8 cm$^{-1}$). A variation width of 0.8 cm$^{-1}$ in the wavenumber of the light P2 corresponds to a response bandwidth of 25 GHz of the photodetector 10.

The light P1 from the first light source 101 is collimated by the lens 108, and then is reflected by the mirror 122 and is incident on the beam splitter 103. The light P2 from the second light source 102 is collimated by the lens 109, and then is sequentially reflected by the mirrors 125 and 126 and is incident on the gas cell 105A. In such a manner, the mirrors 125 and 126 are disposed on an optical path between the second light source 102 and the gas cell 105A.

The gas cell 105A contains gas (sample) to be measured. The gas to be measured is, for example, nitrous oxide (N$_2$O).

A charging pressure of the gas in the gas cell 105A is, for example, 50 Pa. The gas cell 105A is disposed on an optical path between the second light source 102 and the beam splitter 103. The gas cell 105A includes four mirrors 127a, 127b, 127c, and 127d disposed inside a housing. The mirror 127b has a wider width than those of the mirrors 127a, 127c, and 127d, and is disposed to face the mirrors 127a, 127c, and 127d. The mirrors 127a, 127c, and 127d are arranged in a row. As one example, the light P2 incident on the gas cell 105A is reflected by the mirror 127a, and then is reflected by the mirror 127b and travels toward the mirror 127c. Subsequently, the light P2 is reflected by the mirror 127c, and then is reflected by the mirror 127b again and travels toward the mirror 127c. Subsequently, the light P2 is reflected by the mirror 127c again, and then is reflected by the mirror 127b again and travels toward the mirror 127d. Subsequently, the light P2 is reflected by the mirror 127d and is output from the gas cell 105A to the outside. In such a manner, the mirrors 127a to 127d multiply reflect the light incident on the gas cell 105A.

The light P2 output from the gas cell 105A is sequentially reflected by the mirrors 128 and 129, and is incident on the beam splitter 103. The lights P1 and P2 are combined by the beam splitter 103. The combined lights P1 and P2 pass through the isolator 131, and then are incident on the lens 40 and are incident on the photodetector 10. The lens 130 is disposed on an optical path between the gas cell 105A and the beam splitter 103. In this example, the lens 130 is disposed on an optical path between the mirrors 128 and 129. The lens 130 is, for example, a long focal lens and reduces a beam divergence (condensing angle) of the light P2. For example, the lens 130 is disposed such that a focus of the lens 130 is located between the lens 40 and a light receiving surface (incident surface) of the photodetector 10. A focal length of the lens 130 is, for example, 10 to 20 mm or more. The isolator 131 blocks return light from the photodetector 10 while allowing the transmission of the lights P1 and P2 from the beam splitter 103. The return light is light that is reflected by the light receiving surface of the photodetector 10 and that is incident on the isolator 131.

A focal position of the lens 130 will be further described. In the beating spectroscopy device 100A, the light receiving surface of the photodetector 10 is disposed at a focal position of the lens 40, and when light is incident on the lens 40 in a state of parallel light, the incident light is condensed and incident on the light receiving surface of the photodetector 10, and light receiving efficiency is maximized. Since the same state as that of parallel light is realized on a focal plane in the lens 130, it is preferable that the focus of the lens 130 is located on the lens 40. However, when the lens 130 is a long focal lens, since a state close to parallel light is widely obtained in the vicinity of the focal position (focal depth is deep), the focus of the lens 130 may be located between the lens 40 and the light receiving surface (incident surface) of the photodetector 10.

The photodetector 10 detects the lights P1 and P2 that have been combined by the beam splitter 103 and that have transmitted through the isolator 131 and through the lens 40. The spectrum analyzer 104 is connected to the photodetector 10, and scan data is recorded by the spectrum analyzer 104. The photodetector 10 is, as described above, a quantum cascade detector. The active layer 21 of the photodetector 10 includes 50 to 150 unit stacked bodies 24 each formed of a pair of the absorption region 22 and the transport region 23. In the mesa portion 12 included in the photodetector 10, the ratio of the length L1 of the mesa portion 12 in the optical waveguide direction A to the length L2 of the mesa portion 12 in the direction perpendicular to the optical waveguide direction A is greater than 1 and less than 100. In the photodetector 10, the air bridge wiring 16 is electrically connected to the first contact layer 13 and the first electrode 15, and the air bridge wiring 16 is bridged between the first contact layer 13 and the first electrode 15.

[Functions and Effects of Fourth Modification Example]

As described above, the beating spectroscopy device 100A includes the first light source 101 (first quantum cascade laser) that is a fixed wavelength light source; the second light source 102 (second quantum cascade laser) that is variable wavelength light source; the photodetector 10 (quantum cascade detector) that detects the light P1 from the first light source 101 and the light P2 from the second light source 102; and the gas cell 105A (sample holder) configured to hold gas (sample) on an optical path between the second light source 102 and the photodetector 10. The light P1 and the light P2 are detected by the photodetector 10 while the wavelength of the light P2 is changed to scan a frequency of a beating signal having a frequency in accordance with a wavelength difference between the light P1 and the light P2.

In the beating spectroscopy device 100A, a beating signal is detected using the fixed wavelength light source (first light source 101) and the variable wavelength light source (second light source 102) each being formed of a quantum cascade laser, and the quantum cascade detector (photodetector 10). The quantum cascade lasers have a narrowband oscillation spectrum, and the quantum cascade detector has a broadband frequency response characteristic. By a combination of the quantum cascade lasers and the quantum cascade detector, the wavelength scanning range can be widened, and a broadband beating signal can be detected. In addition, an influence of noise of background light can be reduced by combining quantum cascade lasers having a narrow line oscillation spectrum and a quantum cascade detector having a narrowband sensitivity spectrum. Namely, the same function as that of a wavelength filter can be achieved. Further, as described above, the quantum cascade laser and the quantum cascade detector have the same polarization characteristic (linear polarization). For this reason, for example, two quantum cascade lasers and a quantum cascade detector are disposed such that polarization directions coincide with each other, so that an influence of stray light components caused by scattering or the like can be reduced. Namely, the same function as that of a polarization filter can be achieved. In addition, the photodetector 10 is operable at high speed, so that beating detection in a wide frequency range can be performed.

The gas cell 105A contains gas. Accordingly, the beating spectroscopy device 100A is applicable to gas spectroscopy.

The gas cell 105A includes the four mirrors 127a to 127d that multiply reflect the light P2 incident on the gas cell 105A. Since the incident light is multiply reflected, an optical path inside the gas cell 105A can be lengthened, and the accuracy of gas spectroscopy can be improved.

The beating spectroscopy device 100A includes the isolator 131 that is disposed on an optical path between the beam splitter 103 and the photodetector 10 to block return light from the photodetector 10. Accordingly, the return light from the photodetector 10 can be blocked, and the accuracy of spectroscopy can be improved. Since a beating signal in accordance with a wavelength difference between two lights P1 and P2 is detected in beating spectroscopy, an influence of noise of the return light or the like is large. For this reason, disposing the isolator 131 is particularly effective.

The beating spectroscopy device 100A includes the lens 130 that is disposed on the optical path between the gas cell 105A and the beam splitter 103 to reduce the beam divergence of the light P2. Accordingly, the beam divergences of the lights P1 and P2 can be made even. Namely, the light P2 passes through the gas cell 105A, whereas the light P1 does not pass through the gas cell 105A, so that an optical path of the light P2 can be longer than an optical path of the light P1, and the beam divergence of the light P2 can be increased at an incident position on the lens 40. In this respect, in the beating spectroscopy device 100A, the beam divergence of the light P2 is reduced by the lens 130, so that the beam divergences of the lights P1 and P2 can be aligned. Namely, when the lights P1 and P2 are incident on the lens 40, the position of a condensing point on an optical axis changes depending on the beam divergences of the lights P1 and P2. For this reason, when the beam divergences of the lights P1 and P2 are different at incident positions on the lens 40, the lights P1 and P2 are condensed at different positions on the optical axis. In this case, it is difficult for the lights P1 and P2 to be efficiently incident on the photodetector 10, and as a result, the acquisition of a beating signal can be difficult. In contrast, in the beating spectroscopy device 100A, since the beam divergences of the lights P1 and P2 are made even, the lights P1 and P2 can be condensed at the same position on the optical axis, and the light receiving surface of the photodetector 10 is disposed at the condensing point, so that a beating signal can be acquired with high accuracy. Incidentally, in the beating spectroscopy device 100A, the light P1 is collimated by the lens 108 to become parallel light. The lens 130 is particularly effective when the light P2 is multiply reflected inside the gas cell 105A as in the beating spectroscopy device 100A. In addition, in the quantum cascade laser of which output light tends to be diverged, there is a high need for the lens 130 for correcting the light P2 into parallel light. In addition, when the lens 130 is a long focal lens and a focal length thereof is, for example, 10 to 20 mm or more, it is advantageous in that the divergence of the light P2 can be gradually reduced. Incidentally, a beam diameter of the light P2 may be larger than a beam diameter of the light P1 at the incident position on the lens 40.

The second light source 102 is driven based on a ramp wave generated by the function generator 123. In this case, since the spectrum analyzer 104 is easily synchronized with the ramp wave, measurement can be facilitated.

The beating spectroscopy device 100A includes two mirrors 125 and 126 disposed on the optical path between the second light source 102 and the gas cell 105A. Accordingly, the light P2 from the second light source 102 can be incident on the gas cell 105A with high accuracy. For example, the position of an origin of the light P2 incident on the gas cell 105A can be adjusted by the first mirror 125, and the direction of the light P2 can be adjusted by the second mirror 126. The mirrors 125 and 126 are particularly effective when the light P2 is multiply reflected inside the gas cell 105A as in the beating spectroscopy device 100A. The reason is that the longer the optical path inside the gas cell 105A is, the more accurately the light P2 needs to be aligned with the incident position on the gas cell 105A.

The operating temperatures of the first light source 101 and the second light source 102 are 10° C. or more and 40° C. or less. In this case, for example, the temperature of each of the first light source 101 and the second light source 102 can be adjusted using a Peltier element, and a large cooling device (chiller) is not required, so that a configuration of the beating spectroscopy device 100A can be simplified.

In the photodetector 10, the ratio of the length L1 of the mesa portion 12 in the optical waveguide direction A to the length L2 of the mesa portion 12 in the direction perpendicular to the optical waveguide direction A is greater than 1 and less than 100. Accordingly, the length L1 of the mesa portion 12 in the optical waveguide direction A can be ensured, and light can be effectively absorbed in the mesa portion 12.

In the photodetector 10, the active layer 21 includes the 50 or more and 150 or less unit stacked bodies 24 each formed of the absorption region 22 and the transport region 23. Accordingly, the response speed of the photodetector 10 can be increased, and a responsive frequency range can be expanded.

The photodetector 10 includes the air bridge wiring 16 that is bridged between the first contact layer 13 and the first electrode 15 and that is electrically connected to the first contact layer 13 and to the first electrode 15. Accordingly, as described above, increasing response speed, ensuring output signal intensity, and ensuring reliability can be realized. In addition, the wiring width can be widened and inductance can be reduced. In addition, strength of the wiring can be ensured and reliability can be increased.

In the fourth modification example, the sample to be measured is gas, but the sample may be liquid (liquid phase) or solid or may be a semiconductor such as silicon. However, beating spectroscopy having very high wavelength resolution is particularly effective for a gas sample having a sharp absorption line. In the fourth modification example, the light P2 that has transmitted through the sample (gas) is detected, but the light P2 reflected by the sample may be detected. In the fourth modification example, the gas cell 105A includes the four mirrors 127a to 127d, but the gas cell 105A may include at least two mirrors or may include only two mirrors. Alternatively, the gas cell 105A may include only one mirror. Three or more mirrors may be disposed on the optical path between the second light source 102 and the gas cell 105A. The sample holder may be configured to hold the sample on the optical path between the second light source 102 and the photodetector 10, and the sample holder itself may not be disposed on the optical path.

The invention claimed is:

1. A beating spectroscopy device comprising:
a first quantum cascade laser that is a fixed wavelength light source;
a second quantum cascade laser that is a variable wavelength light source;
a quantum cascade detector that detects first light traveling along a first optical path from the first quantum cascade laser to the quantum cascade detector and second light traveling along a second optical path from the second quantum cascade laser to the quantum cascade detector, wherein the quantum cascade detector includes a light receiving surface formed by a cleavage surface of a stripe-shaped mesa portion;
a sample holder configured to hold a sample on the second optical path, wherein the sample holder causes the second optical path to be longer than the first optical path;
an optical combiner that combines the first light and the second light; and
a first lens disposed on the second optical path between the sample holder and the optical combiner to reduce a beam divergence of the second light that is increased due to the second optical path being longer than the first optical path; and a second lens disposed between the optical combiner and the quantum cascade detector to converge the first light and the second light onto the light receiving surface,
wherein the first light and the second light are detected by the quantum cascade detector while a wavelength of the second light is changed to scan a frequency of a beating signal having a frequency in accordance with a wavelength difference between the first light and the second light, and
wherein a converging lens is not disposed on the first optical path between the first quantum cascade laser and the optical combiner.

2. The beating spectroscopy device according to claim 1, wherein the sample holder contains gas.

3. The beating spectroscopy device according to claim 2, wherein the sample holder includes at least two mirrors that multiply reflect light incident on the sample holder.

4. The beating spectroscopy device according to claim 3, further comprising:
at least two mirrors disposed on an optical path between the second quantum cascade laser and the sample holder.

5. The beating spectroscopy device according to claim 1, further comprising:
an isolator disposed on an optical path between the optical combiner and the quantum cascade detector to block return light from the quantum cascade detector.

6. The beating spectroscopy device according to claim 1, further comprising:
a function generator that generates a ramp wave,
wherein the second quantum cascade laser is driven based on the ramp wave generated by the function generator.

7. The beating spectroscopy device according to claim 1, further comprising:
at least two mirrors disposed on an optical path between the second quantum cascade laser and the sample holder.

8. The beating spectroscopy device according to claim 1, wherein operating temperatures of the first quantum cascade laser and the second quantum cascade laser are 10° C. or more and 40° C. or less.

9. The beating spectroscopy device according to claim 1, wherein the quantum cascade detector includes a semiconductor substrate, and a mesa portion that includes an active layer and that is formed on the semiconductor substrate to extend along an optical waveguide direction, and
a ratio of a length of the mesa portion in the optical waveguide direction to a length of the mesa portion in a direction perpendicular to the optical waveguide direction is greater than 1 and less than 100.

10. The beating spectroscopy device according to claim 1, wherein the quantum cascade detector includes a semiconductor substrate, and a mesa portion that includes an active layer and that is formed on the semiconductor substrate to extend along an optical waveguide direction, and
the active layer includes 50 or more and 150 or less unit stacked bodies each consisting of an absorption region and a transport region.

11. The beating spectroscopy device according to claim 1, wherein the quantum cascade detector includes a semiconductor substrate, a mesa portion that includes an active layer and that is formed on the semiconductor substrate to extend along an optical waveguide direction, a contact layer formed on a surface of the mesa portion on a side opposite to the semiconductor substrate, an electrode formed on the semiconductor substrate, and an air bridge wiring bridged between the contact layer and the electrode and electrically connected to the contact layer and the electrode.

12. The beating spectroscopy device according to claim 1, wherein each of the first quantum cascade laser and the second quantum cascade laser is a distributed feedback quantum cascade laser.

13. The beating spectroscopy device according to claim 1, wherein the second quantum cascade laser is a distributed feedback quantum cascade laser configured to output light having a single oscillation wavelength when a current is injected.

14. The beating spectroscopy device according to claim 1, wherein the first quantum cascade laser and the second quantum cascade laser are capable of outputting light having a same wavelength with each other.

15. The beating spectroscopy device according to claim 1, wherein each of the quantum cascade detector, the first quantum cascade laser, and the second quantum cascade laser has a linear polarization characteristic, and the quantum cascade detector, the first quantum cascade laser, and the second quantum cascade laser are disposed such that polarization directions coincide with each other.

* * * * *